(12) United States Patent
Naito et al.

(10) Patent No.: US 9,614,178 B2
(45) Date of Patent: Apr. 4, 2017

(54) ELECTRONIC COMPONENT, PROCESS FOR PRODUCING SAME, SEALING MATERIAL PASTE, AND FILLER PARTICLES

(71) Applicant: Hitachi Chemical Company, Ltd., Tokyo (JP)

(72) Inventors: Takashi Naito, Tokyo (JP); Shinichi Tachizono, Tokyo (JP); Kei Yoshimura, Tokyo (JP); Yuji Hashiba, Tokyo (JP); Takuya Aoyagi, Tokyo (JP); Masanori Miyagi, Tokyo (JP); Motomune Kodama, Tokyo (JP); Yuichi Sawai, Tokyo (JP); Tadashi Fujieda, Tokyo (JP); Takeshi Tsukamoto, Tokyo (JP); Hajime Murakami, Tokyo (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 14/435,943

(22) PCT Filed: Oct. 9, 2013

(86) PCT No.: PCT/JP2013/077406
§ 371 (c)(1),
(2) Date: Apr. 15, 2015

(87) PCT Pub. No.: WO2014/061515
PCT Pub. Date: Apr. 24, 2014

(65) Prior Publication Data
US 2015/0270508 A1 Sep. 24, 2015

(30) Foreign Application Priority Data

Oct. 18, 2012 (JP) ................................ 2012-230436

(51) Int. Cl.
*H01L 21/00* (2006.01)
*H01L 51/52* (2006.01)
(Continued)

(52) U.S. Cl.
CPC ............ *H01L 51/5246* (2013.01); *C03C 8/14* (2013.01); *C03C 8/20* (2013.01); *C03C 8/24* (2013.01);
(Continued)

(58) Field of Classification Search
CPC ........ H01L 51/5246; H01L 51/56; C08K 3/32
See application file for complete search history.

(56) References Cited

U.S. PATENT DOCUMENTS 5,663,109 A 9/1997 Dietz et al.
6,122,430 A 9/2000 Bookbinder et al.
(Continued)

FOREIGN PATENT DOCUMENTS

CN 104520989 A 4/2015
JP 2008-527656 A 7/2008
(Continued)

OTHER PUBLICATIONS

Taiwanese Office Action for TW 102137310 dated Dec. 14, 2015, 8 pages.
(Continued)

*Primary Examiner* — Laura Menz
(74) *Attorney, Agent, or Firm* — Volpe and Koenig, P.C.

(57) ABSTRACT

In an electronic component including two substrates at least one of which is transparent, an organic member arranged between these substrates, and a bonding portion located onto respective outer circumferential portions of the two substrates, this bonding portion includes a low-melting glass and filler particles. The low-melting glass includes vanadium oxide. The filler particles include a low thermally- (Continued)

expandable material, and an oxide containing a bivalent transition metal as a constituent element. The oxide is dispersed in the low thermally-expandable material, and the low thermally-expandable material has a thermal expansion coefficient of $5 \times 10^{-7}/°$ C. or less in a temperature range from 30 to 250° C. This invention makes it possible to heat the filler particles by irradiation with a laser to give the electronic component which is a component having a highly reliable bonding portion.

19 Claims, 16 Drawing Sheets

(51) Int. Cl.
    *C03C 8/24*     (2006.01)
    *C03C 27/06*     (2006.01)
    *C03C 8/14*     (2006.01)
    *C03C 8/20*     (2006.01)
    *C08K 3/22*     (2006.01)
    *C08K 3/32*     (2006.01)
    *H01L 51/56*     (2006.01)

(52) U.S. Cl.
    CPC ................ *C03C 27/06* (2013.01); *C08K 3/22* (2013.01); *C08K 3/32* (2013.01); *H01L 51/56* (2013.01); *C08K 2003/2248* (2013.01); *C08K 2003/2262* (2013.01); *C08K 2003/2265* (2013.01); *C08K 2003/2289* (2013.01); *C08K 2003/2293* (2013.01); *C08K 2003/328* (2013.01); *H01L 51/525* (2013.01)

(56) References Cited

U.S. PATENT DOCUMENTS

| | | | |
|---|---|---|---|
| 2004/0207314 A1 | 10/2004 | Aitken et al. | |
| 2010/0180934 A1* | 7/2010 | Naito | C03C 3/21 136/252 |
| 2015/0187510 A1 | 7/2015 | Naito et al. | |
| 2015/0270508 A1* | 9/2015 | Naito | C03C 8/24 257/40 |

FOREIGN PATENT DOCUMENTS

| | | | |
|---|---|---|---|
| JP | 2008247659 A | * | 10/2008 |
| JP | 4540669 B2 | | 7/2010 |
| JP | 2011-057477 A | | 3/2011 |
| JP | 2012-041196 A | | 3/2012 |
| TW | 201036929 A1 | | 10/2010 |
| WO | 2004/095597 A2 | | 11/2004 |
| WO | 2007/067402 A2 | | 6/2007 |

OTHER PUBLICATIONS

Chinese Office Action for Application No. 201380053612.0 dated Apr. 22, 2016, 11 pages.

\* cited by examiner $Zr_2(WO_4)(PO_4)_2$ CONTENT BY PERCENTAGE (% BY MASS)

ELECTRONIC COMPONENT, PROCESS FOR PRODUCING SAME, SEALING MATERIAL PASTE, AND FILLER PARTICLES

TECHNICAL FIELD

The present invention relates to an electronic component and a method for producing the component, a sealing material paste, and filler particles.

BACKGROUND ART

In an electronic component in which two substrates at least one of which is transparent have an organic element or an organic material therebetween, the following measures are taken to protect the organic element or organic material from moisture, water and others: for example, respective outer circumferential portions of the two substrates are bonded to each other through a sealing material of a resin; and further a drying agent is located inside the electronic component. However, the bonding through the resin is insufficient in a gas barrier performance (an air-tightness), so that water molecules gradually invade the inside. Thus, the bonding through the resin does not give a sufficient reliability.

In the meantime, in the case of a sealing material containing a low-melting glass and filler particles for making the thermal expansion coefficient of the sealing material consistent with that of the substrates, the substrates can be bonded to each other with the high gas barrier performance (the high air-tightness). However, this sealing material needs to be made remarkably higher in bonding temperature than the resin sealing material to cause a problem that the resultant thermal environment exceeds the heat resistance of the organic element or organic material located inside the electronic component.

A means or method invented as a result thereof is a laser sealing which can attain a local heating. The laser sealing makes use of a sealing material containing a low-melting glass capable of attaining airtight bonding, and low-expandable filler particles. This low-melting glass needs to have a property of absorbing a laser ray radiated across a transparent substrate to be raised in temperature, thereby softening and flowing. This method makes it possible to heat only respective outer circumferential portions of two substrates at least one of which is transparent. Thus, a glass bonding high in the gas barrier performance (the air-tightness) can be attained without giving any thermal damage to the organic element or organic material located inside the electronic component.

In a display or some other in which an organic light emitting diode (OLED), a glass substrate having in its outer circumferential portion a pre-fired sealing material is put onto a glass substrate on which another OLED and interconnections are formed, and then a laser is radiated across one of the glass substrates onto the sealing material, thereby causing the low-melting glass in the sealing material to soften and flow. In this way, the two glass substrates are bonded to each other.

Patent Literature 1 discloses an organic light emitting diode display using an airtight seal, in which a material used for the airtight seal is a frit containing a predetermined glass and a lithium aluminosilicate filler, the lithium aluminosilicate filler making the frit low in a thermal expansion coefficient, and in which the material is heated through a laser to be meltable. This frit contains a V—P—Sb—O based low-melting glass heatable through a laser, and a filler $LiAlSiO_4$ (β-eucryptite) for making the thermal expansion coefficient of the frit consistent with that of a glass substrate.

Patent Literature 2 discloses a technique of using the same frit as disclosed in Patent Literature 1 and further sintering the frit preliminarily in a nitrogen atmosphere to prevent the immersion endurance from being lowered.

PRIOR ART DOCUMENTS

Patent Literature

Patent Literature 1: Japanese Patent No. 4540669
Patent Literature 2: Re-publication of PCT International Publication No. 2008-527656

SUMMARY OF INVENTION

Technical Problem

About the respective frits described in Patent Literatures 1 and 2, a sufficient consideration is not given to the filler (filler particles) contained in each of the frits (sealing materials). When a laser is radiated onto the sealing material, the low-melting glass contained therein absorbs the laser to be raised in temperature, thereby softening and flowing. However, the filler particles are not directly heated by the radiation of the laser thereonto, but are heated by heat from the low-melting glass raised in temperature. When the filler particles are not sufficiently heated, the filler does not produce a sufficient expansion-lowering effect so that the frit is not consistent in thermal expansion coefficient with the substrates. Thus, there remains a problem that a highly reliable bonding portion cannot be gained.

Thus, an object of the present invention is to provide filler particles that can be heated by irradiation with a laser; and a sealing material paste including the filler particles. Another object thereof is to provide an electronic component wherein these are used to produce a highly reliable bonding portion; and a method for producing this electronic component.

Solution to Problem

In order to solve the afore-mentioned problem, the present invention is an electronic component including two substrates at least one of which is transparent, an organic member arranged between these substrates, and a bonding portion located onto respective outer circumferential portions of the two substrates, wherein the bonding portion includes a low-melting glass, and filler particles, the low-melting glass includes vanadium oxide, the filler particles include a low thermally-expandable material, and an oxide containing a bivalent transition metal as a constituent element, the oxide is dispersed in the low thermally-expandable material, and the low thermally-expandable material has a thermal expansion coefficient of $5 \times 10^{-7}/°$ C. or less in a temperature range from 30 to 250° C.

Advantageous Effects of Invention

The present invention makes it possible to heat filler particles by irradiation with a laser, and gain an electronic component having a highly reliable bonding portion.

DESCRIPTION OF EMBODIMENTS

Figure 1:
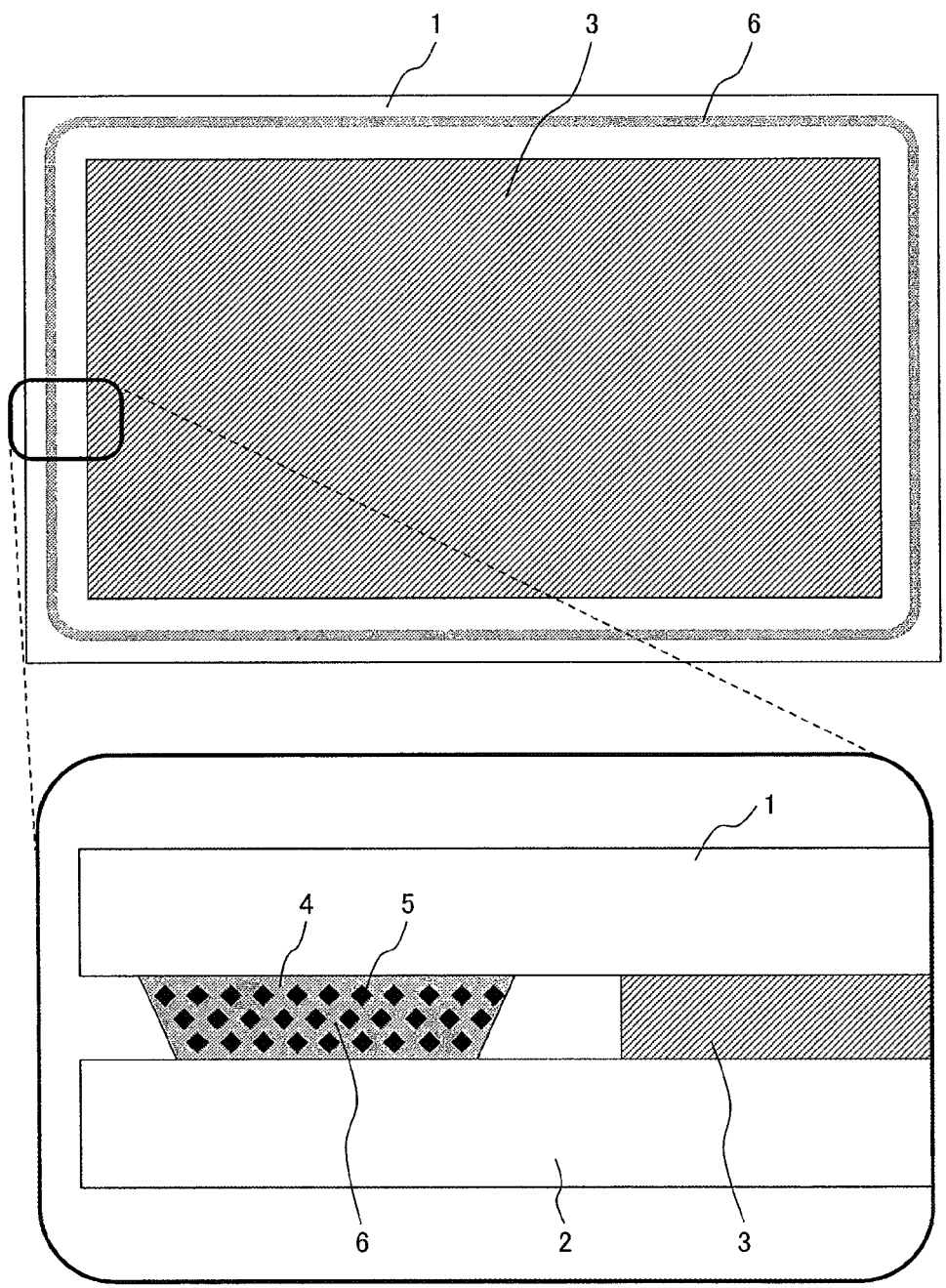
FIG. 1 is a top view illustrating an example of an electronic component, and a schematic sectional view of its bonding portion.
Figure 2:
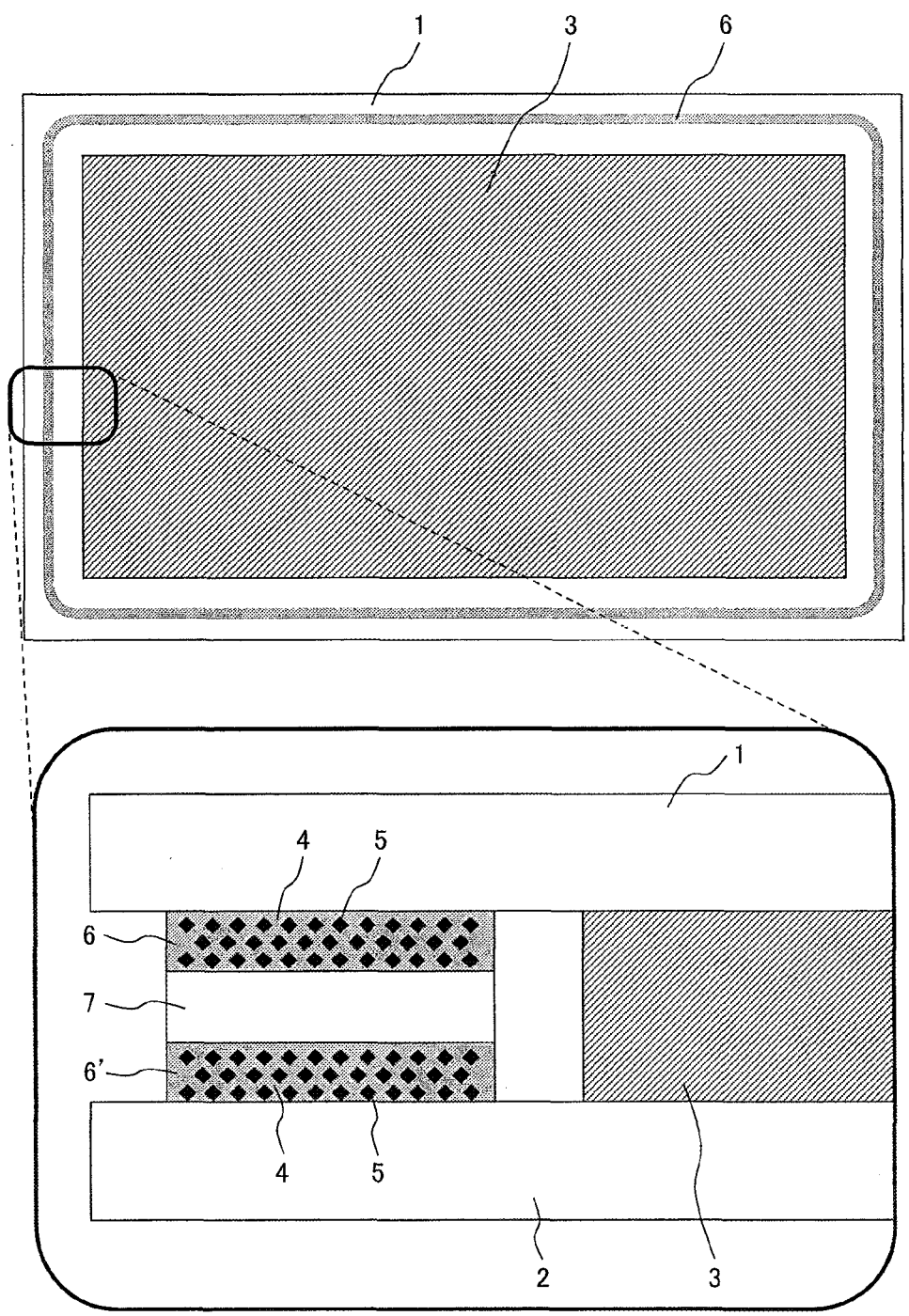
FIG. 2 is a top view illustrating another example of the electronic component, and a schematic sectional view of its bonding portion.

FIGS. 1 and 2 illustrate two examples of an electronic component, respectively.

FIG. 1 is a top view illustrating most basic one of the examples, and a schematic sectional view of a bonding portion thereof.

As illustrated in the top view of the figure, an organic member 3 (for example, an organic element or organic material) is located at a central portion of a flat plane of a substrate 1 which constitutes the electronic component. A bonding portion 6 is located onto an outer circumferential portion of the flat plane of the substrate 1.

As illustrated in the sectional view of the figure, the electronic component includes the substrate 1, another substrate 2, and the organic member 3 and the bonding portion 6 that are sandwiched therebetween. At least one of the two substrates 1 and 2 is transparent. A plurality of organic members 3 may be arranged. The bonding portion 6 is a portion containing a low-melting glass 4 and many filler particles 5. The two substrates 1 and 2 are bonded to each other through the bonding portion 6. The bonding portion 6 is a portion obtained by radiating a laser onto a sealing portion to be heated, this sealing portion being formed by painting a sealing material paste containing the filler particles 5, low-melting glass particles containing vanadium oxide, and an organic solvent, and then drying and firing the painted paste. The sealing material is an element constituting the sealing material paste, and is composed substantially of the filler particles and particles of the low-melting glass (low-melting glass particles). The sealing portion is made substantially of the sealing material.

In the case of the electronic component illustrated in FIG. 2, the whole of the structure thereof is equivalent to that of the electronic component illustrated in FIG. 1. However, in order to make the interval between substrates 1 and 2 large, a spacer 7 is sandwiched therebetween, and bonding portions 6 and 6' are set up. In the case of the electronic component in FIG. 2, at least one of the two substrates 1 and 2, and the spacer 7 are transparent.

The bonding portions 6 and 6' each contain a low-melting glass 4 and filler particles 5. The low-melting glass 4 contains vanadium oxide. In the filler particles 5, an oxide containing a bivalent transition metal is dispersed.

The low-melting glass 4 and the filler particles 5 which satisfy the above-mentioned requirements each have a property of absorbing a laser ray to be raised in temperature. This is because vanadium oxide in the low-melting glass 4, and the oxide containing the bivalent transition metal in the filler particles 5 absorb the laser ray. The filler particles 5 contain a low thermally-expandable material and the oxide containing the bivalent transition metal. The low thermally-expandable material contributes mainly to the low thermal expandability (of the particles) while the bivalent transition metal dispersed in the low thermally-expandable material contributes to the laser absorption.

However, about the filler particles 5, the oxide containing the bivalent transition metal may unfavorably increase the thermal expansion coefficient of the filler particles 5. Thus, it is necessary to pay attention to the precipitation amount (content) thereof. Even when the precipitation amount of the oxide containing the bivalent transition metal is small, the filler particles 5 absorb a laser to be heated. It is therefore unnecessary to make the precipitation amount large. In other words, the filler particles 5 gain laser absorbing performance without increasing the thermal expansion coefficient of the filler particles 5 very much.

Conventionally, a low-melting glass is irradiated with a laser so as to be heated, thereby softening and flowing; and filler particles take away a part of the heat to be indirectly heated. In the present invention, the filler particles also become able to be directly heated by irradiation with a laser, so that the sealing material can be more effectively heated than in the prior art. Consequently, the respective outer circumferential portions of the two substrates can be bonded to each other without damaging the organic member thermally. In this way, the electronic component can be improved in reliability and productivity.

The wavelength of the used laser ranges preferably from 400 to 1100 nm. Any wavelength in this range permits the laser to penetrate the transparent substrate 1 to heat both of the low-melting glass 4 and the filler particles 5 in the sealing material simultaneously. When the wavelength is 400 nm or more, the transparent substrate, and the organic member inside the substrate are not easily heated or deteriorated. Conversely, when the wavelength is 1100 nm or less, the laser is easily absorbed into the low-melting glass 4. Moreover, the degree that a water-containing site is heated can also be decreased. In the filler particles 5 in which the oxide containing the bivalent transition metal precipitates, the transition metal is preferably one or more selected from manganese (Mn), iron (Fe), cobalt (Co), nickel (Ni), and copper (Ci). These transition metals are high in performance of absorbing a laser ray having a wavelength of 400 to 1100 nm to be effectively heatable. In a case where about numerical numbers X and Y, the expression "X to Y" is used in the present invention, the expression denotes "X to Y both inclusive".

It is preferred to use, as the low thermally-expandable material of the filler particles 5, zirconium phosphate tungstate $Zr_2(WO_4)(PO_4)_2$, $LiAlSiO_4$, $SiO_2$, or $Mg_2Al_4Si_5O_{18}$. These materials may be used in any combination of two or more thereof. In the particles of one or more of these materials, the oxide containing the bivalent transition metal is dispersed. When the low-melting glass 4 contains vanadium oxide, filler particles in which zirconium phosphate tungstate is used as the low thermally-expandable material can be incorporated in a larger proportion into the bonding portions 6 and 6' than filler particles in which any other low thermally-expandable material is used. This matter makes it easy that the bonding portion 6 and 6' gain a larger low thermally-expanding effect. The oxide containing the bivalent transition metal and dispersed in the particles is preferably one or more selected from manganese tungstate ($MnWO_4$), iron tungstate ($FeWO_4$), cobalt tungstate ($CoWO_4$), nickel tungstate ($NiWO_4$), and copper tungstate ($CuWO_4$). In particular, zirconium phosphate tungstate particles have a very small thermal expansion coefficient of $-35 \times 10^{-7}/°$ C., and further cause the low-melting glass 4 containing vanadium oxide not to be easily crystallized. Thus, the particles give a good adhesiveness and air-tightness (to the electronic component).

However, only the zirconium phosphate tungstate particles have a poor function of absorbing a laser light to be heatable. Thus, one or more selected from the above-mentioned oxides each having the bivalent transition metal are precipitated into the zirconium phosphate tungstate particles, whereby the zirconium phosphate tungstate particles become able to absorb a laser having a wavelength ranging from 400 to 1100 nm to be heatable by themselves. These transition metal oxides are characterized by precipitating evenly in the zirconium phosphate tungstate particles with ease. When these transition metal oxides are evenly precipitated in the zirconium phosphate tungstate particles, zirconium phosphate ($Zr_2O(PO_4)_2$) may be precipitated as a byproduct. In the same manner as zirconium phosphate tungstate, this compound zirconium phosphate is poor in laser absorbing performance. However, the thermal expansion coefficient thereof is a relatively small value of $+7 \times 10^{-7}/°$ C.

Furthermore, the content by percentage of the zirconium phosphate tungstate in the filler particles 5 is preferably from 80 to 98% by mass. When the content by percentage is 80% or more by mass, the thermal-expansion reduction effect of the filler particles 5 is easily obtained. It is preferred that the filler particles 5 have at least a minus (negative) thermal expansion coefficient. When the content by percentage is 98% or less by mass, the transition metal oxide is present in an amount sufficient for causing the oxide to absorb a laser, so that the efficiency of heating the filler particles 5 is good.

It is effective that the low-melting glass 4 to be combined with the filler particles 5 contains vanadium oxide. The glass 4 absorbs a laser to be raised in temperature, so that the glass 4 softens and flows. The glass 4 is preferably an oxide glass containing vanadium (V), tellurium (Te), iron (Fe) and phosphorus (P). This low-melting glass 4 is high in laser absorbing performance. Furthermore, when the low-melting glass 4 is produced to have a transition temperature $T_g$ of 350° C. or lower and a softening point $T_s$ of 410° C. or lower, the glass 4 can easily be caused to soften and flow by irradiation with a laser. The transition point $T_g$ and the softening point $T_s$ referred to herein are characteristic temperatures according to differential thermoanalysis (DTA), which will be later described in detail. The transition point $T_g$ is the starting temperature of a first endothermic peak, and the softening point $T_s$ is the peak temperature of a second endothermic peak.

The low-melting glass 4 is preferably an oxide glass containing vanadium (V), silver (Ag), and tellurium (Te). This oxide glass is poorer in laser absorbing performance than the above-mentioned oxide glass containing vanadium, tellurium, iron and phosphorus. However, the oxide glass is very low in transition point $T_g$ and softening point $T_s$; thus, the glass can easily be caused to soften and flow by irradiation with a laser. In order to cause the glass easily to soften and flow, it is preferred to set the transition point $T_g$ and the softening point $T_s$ to 240° C. or lower, and 300° C. or lower, respectively.

About the respective contents of the low-melting glass 4 and the filler particles 5 in each of the bonding portions 6 and 6', it is preferred that when the amount of the low-melting glass 4 is regarded as 100 parts by volume, the amount of the filler particles 5 is from 10 to 100 parts by volume. When the amount of the filler particles 5 is 10 parts or more by volume, the thermal-expansion reduction effect of the bonding portions 6 and 6' is easily obtained. Conversely, when the amount is 100 parts or less by volume, the softening fluidity of the low-melting glass 4 is maintained so that the substrates can easily gain a strong bonding therebetween.

When the electronic component illustrated in FIG. 1 is produced, the thickness of the sealing portion is preferably 20 μm or less. When the thickness is 20 μm or less, the low-melting glass 4 and the filler particles 5 contained in a region of the sealing portion that is remote from the laser-radiated transparent substrate 1 can each be sufficiently heated. In this way, the low-melting glass 4 can sufficiently soften and flow to show a good softening fluidity, as a whole, along the thickness direction of the sealing portion. As a result, an airtight bonding portion high in reliability can easily be obtained.

When the interval between the two substrates 1 and 2 is large, in particular, the interval is 100 μm or more in the production of the electronic component illustrated in FIG. 2, it is preferred to bond the substrates to each other through the spacer 7. The thickness of each of respective sealing portions located onto both surfaces of the spacer 7 at this time is preferably set to 20 μm or less in the same manner as described above.

The transparent substrate 1 may be a glass substrate or a resin substrate. When the substrate 1 is transparent, the substrate is small in laser absorptance and is high in laser transmittance, the wavelength of each of the "lasers" referred to herein being from 400 to 1100 nm. Accordingly, even when a laser having a wavelength ranging from 400 to 1100 nm is radiated thereto, the substrates 1 and 2 are hardly heated so that the laser penetrates the substrates. As a result, the laser can radiate onto only the desired-portion-positioned sealing material. Both of the low-melting glass 4 and the filler particles 5 in the laser-radiated sealing, material are heated so that the low-melting glass 4 softens and flows. Thus, the respective outer circumferential portions of the substrates 1 and 2 can be effectively bonded to each other.

According to the above description, the present invention is widely and effectively applied to displays each having therein an organic light emitting diode, colorant-sensitized type solar batteries each having therein an organic colorant, solar cells which are bonded to each other through a resin and which each have therein a photoelectric transducer, and others. The present invention is also applicable to cases in each of which an element or material low in heat resistance is used inside an electronic component. Thus, a scope to which the present invention is applicable is not limited only to the above-mentioned electronic component.

The present invention is a sealing material paste containing the above-mentioned filler particles and low-melting glass particles, and an organic solvent. When the low-melting glass particles are an oxide glass containing vanadium, tellurium, iron and phosphorus, the organic solvent is preferably butyl carbitol acetate. Furthermore, as an organic resin binder, the use of ethylcellulose or nitrocellulose is preferred. Since butyl carbitol acetate does not corrode the low-melting glass particles or the filler particles, the lifespan of the sealing material paste can be made long.

When the low-melting glass particles are an oxide glass containing vanadium, silver and tellurium, the organic solvent is preferably α-terpineol. This low-melting glass softens and flows easily at a very low temperature, so that many bubbles are liable to be generated in the sealing material when the binder is removed. Since α-terpineol is a highly viscous solvent, a good sealing material can be produced even when no organic resin binder is used.

The sealing material paste is generally painted by a screen printing or dispenser method; thus, the average particle diameter of the filler particles or the low-melting glass particles is preferably 5 μm or less, in particular preferably 3 μm or less. A strong and airtight bonding is easily obtained by adjusting the content of the filler particles in the sealing material paste in the range of 10 to 100 parts by volume for 100 parts by volume of the low-melting glass particles therein.

Figure 3:
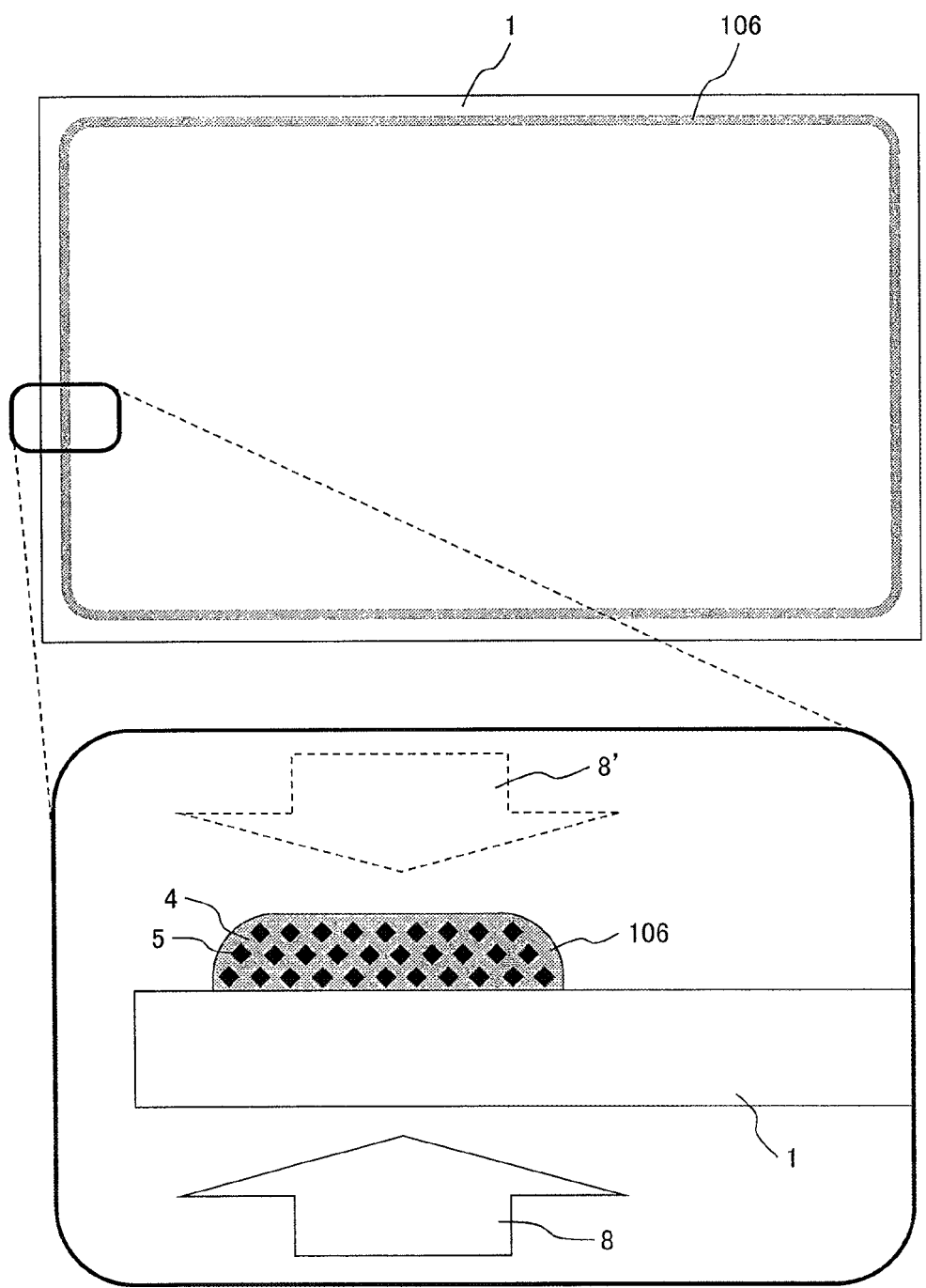
FIG. 3 is a top view and a partial sectional view illustrating a process for producing the electronic component in FIG. 1.
Figure 4:
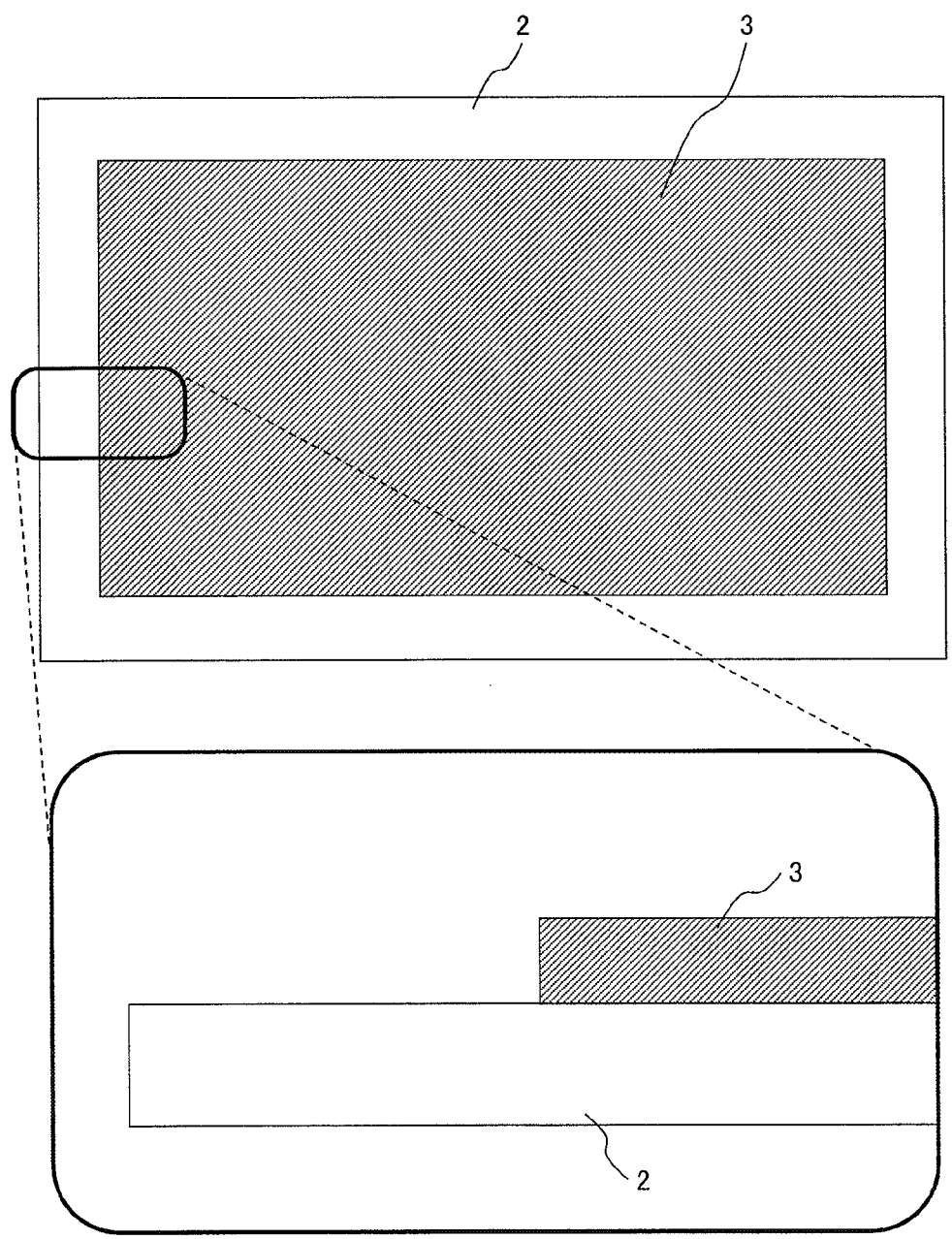
FIG. 4 is a top view and a partial sectional view illustrating the process for producing the electronic component in FIG. 1.
Figure 5:
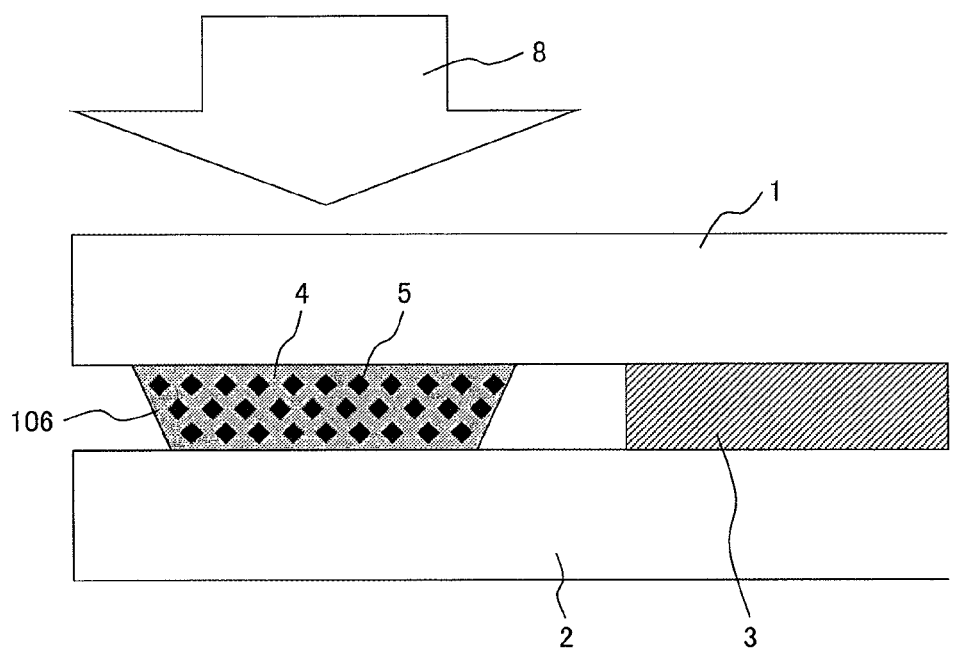
FIG. 5 is a partial sectional view illustrating the process for producing the electronic component in FIG. 1.

The following will describe a method for producing an electronic component. With reference to FIGS. 3 to 5, a description will be made about a method for producing the electronic component illustrated in FIG. 1.

FIGS. 3 to 5 illustrate a process for producing the electronic component in FIG. 1.

FIG. 3 illustrates a state that a fired sealing material 106 containing a low-melting glass 4 and filler particles 5 is located onto an outer circumferential portion of a transparent substrate 1.

A paste of the sealing material is initially painted onto the outer circumferential portion of the substrate 1 by a screen printing or dispenser method, and the workpiece is dried. After the drying, the sealing material is not in any paste form. Thus, the sealing material after the drying is called the "dried sealing material".

When the substrate 1 is a glass substrate, the low-melting glass 4 and the filler particles 5 in the dried sealing material are heated in a firing furnace, or by irradiation with a laser 8 or 8' having a wavelength ranging from 400 to 1100 nm, so that the low-melting glass 4 is caused to soften and flow. By the firing of the dried sealing material, a fired sealing material 106 is formed on the substrate 1. In the meantime, when the substrate 1 is a resin substrate, the dried sealing material is fired by irradiation with a laser 8 or 8' since the resin is low in heat resistance so that no firing furnace is usable. By the firing, a fired sealing material 106 is formed on the outer circumferential portion of the transparent substrate 1.

Next, as illustrated in 4, one or more organic members 3 are located onto another substrate 2. The material of the substrate 2 may be different from or the same as that of the substrate 1.

As illustrated in FIG. 5, the surface of the substrate 1 on which the fired sealing material 106 is located is caused to face the surface of the substrate 2 on which the organic member(s) 3 is/are located, and the two substrates 1 and 2 are positioned to each other so that the organic member(s) 3 is/are arranged in an internal space created by the substrates 1 and 2, and the sealing material 106.

When the dried sealing material on the substrate 1 is fired by irradiation with the laser, portions of the substrate 1 other than the laser-radiated outer circumferential portion are not easily heated. Thus, the organic member(s) 3 may be formed on the substrate 1. The laser 8 which has a wavelength ranging from 400 to 1100 nm is radiated across the transparent substrate 1 onto the fired sealing material 106. It is necessary at this time to pay attention not to radiate the laser 8 to the organic member(s) 3 located inside the electronic component. This is because the organic member(s) 3 may be damaged or deteriorated by the irradiation with the laser 8. When the substrate 2 is transparent, the laser may be radiated onto the workpiece from the substrate 2 side thereof. By the radiation of the laser 8, both of the low-melting glass 4 and the filler particles 5 in the fired sealing material 106 are heated. The low-melting glass 4 then softens and flows so that the outer circumferential portions of the two substrates 1 and 2 are bonded to each other through the fired sealing material 106. The moieties bonded to each other through the fired sealing material 106 can be called a bonding portion.

The following will describe a method for producing the electronic component illustrated in FIG. 2 with reference to FIGS. 6 to 10.

Figure 6:
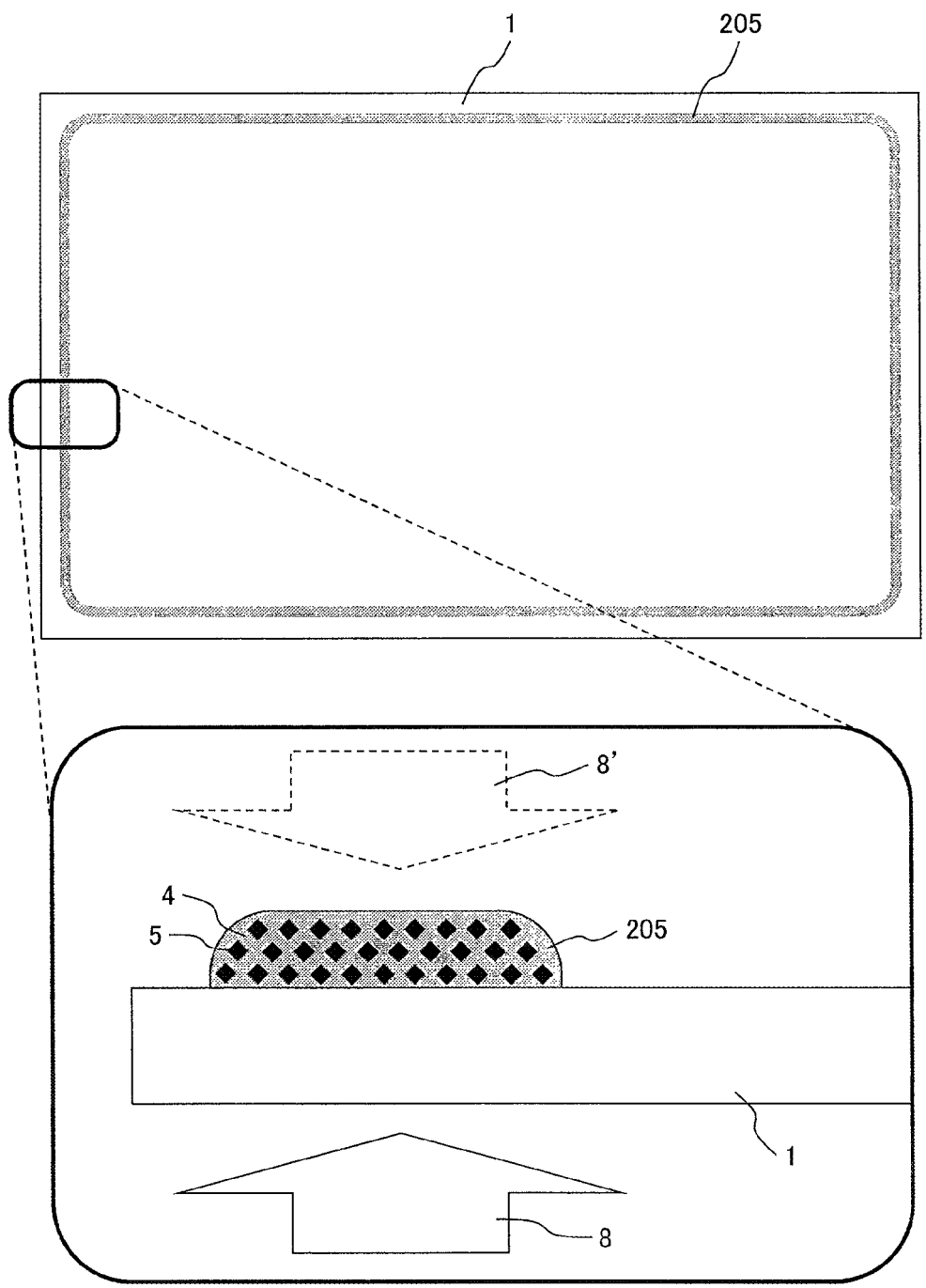
FIG. 6 is a top view and a partial sectional view illustrating a process for producing the electronic component in FIG. 2.

In the same manner as FIG. 3, FIG. 6 illustrates a state that a paste of a sealing material is painted onto an outer circumferential portion of a substrate 1 by a screen printing or dispenser method, and the workpiece is dried (dried sealing material 205).

Figure 7:
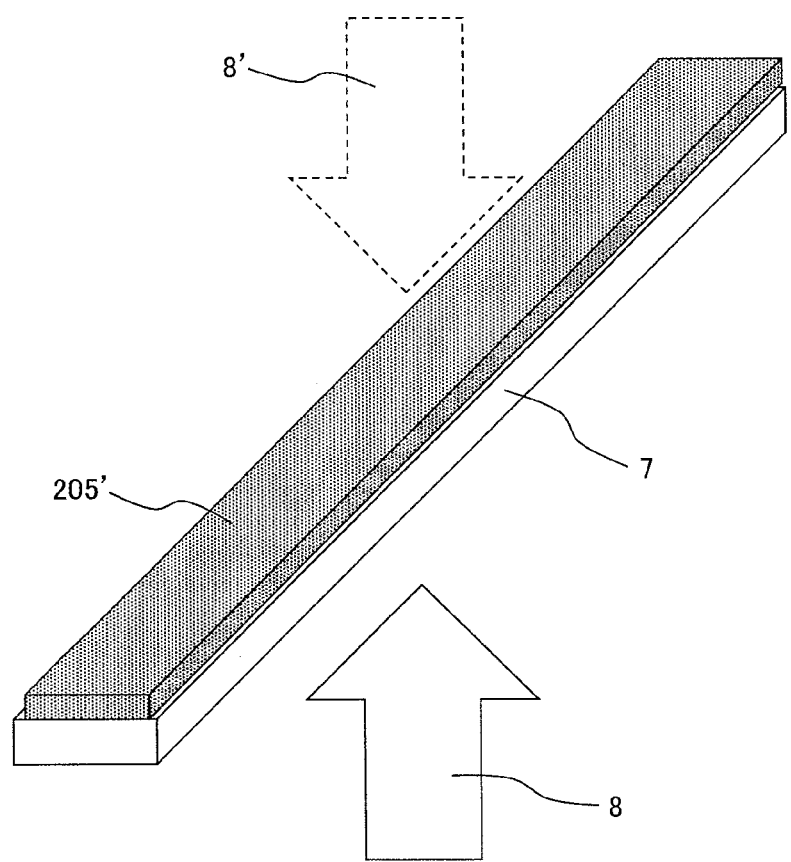
FIG. 7 is a perspective view illustrating the process for producing the electronic component in FIG. 2.

Next, as illustrated in FIG. 7, a dried sealing material 205' is located onto one surface of a spacer 7. In a method therefor, the sealing material paste is painted onto a surface of the spacer 7 that is to be bonded to a substrate 2 by a screen printing or dispenser method, and then the workpiece is dried (dried sealing material 205'). In the case of using the spacer 7 that is one having a high heat resistance and made of glass, the dried sealing material 205' is heated in a firing furnace or by irradiation with a laser 8 having a wavelength ranging from 400 to 1100 nm. The heating causes the low-melting glass to soften and flow, and causes the dried sealing material 205' to be fired, thereby forming a fired sealing material on the spacer 7. In the case of using the spacer 7 that is one made of, for example, a resin low in heat resistance, no firing furnace is usable. Thus, the fired sealing material is formed on the spacer 7 by irradiation with the laser 8.

Figure 8:
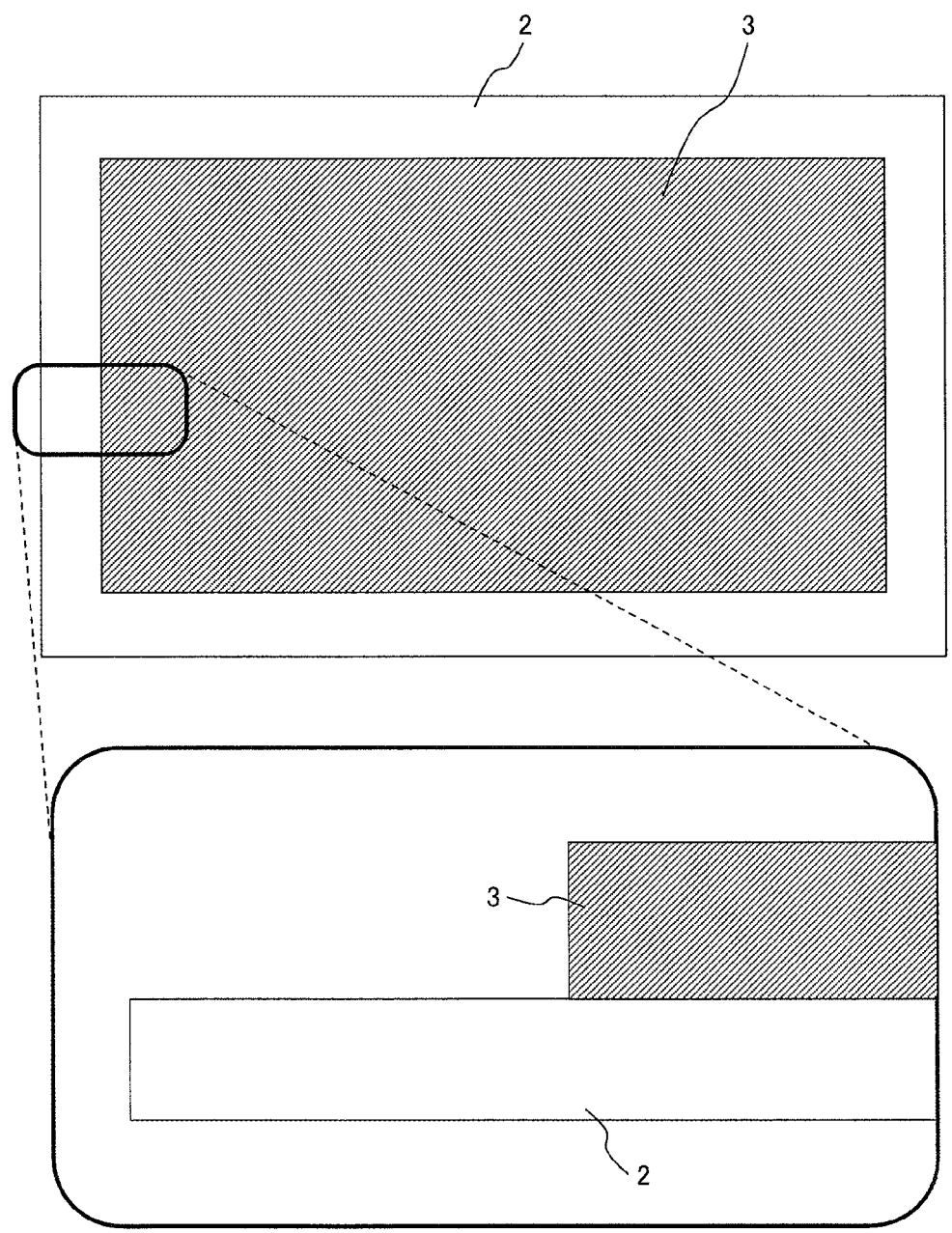
FIG. 8 is a top view and a partial sectional view illustrating the process for producing the electronic component in FIG. 2.

Next, as illustrated in FIG. 8, one or more organic members 3 are located onto a substrate 2. This step is the same as illustrated in FIG. 4.

Figure 9:
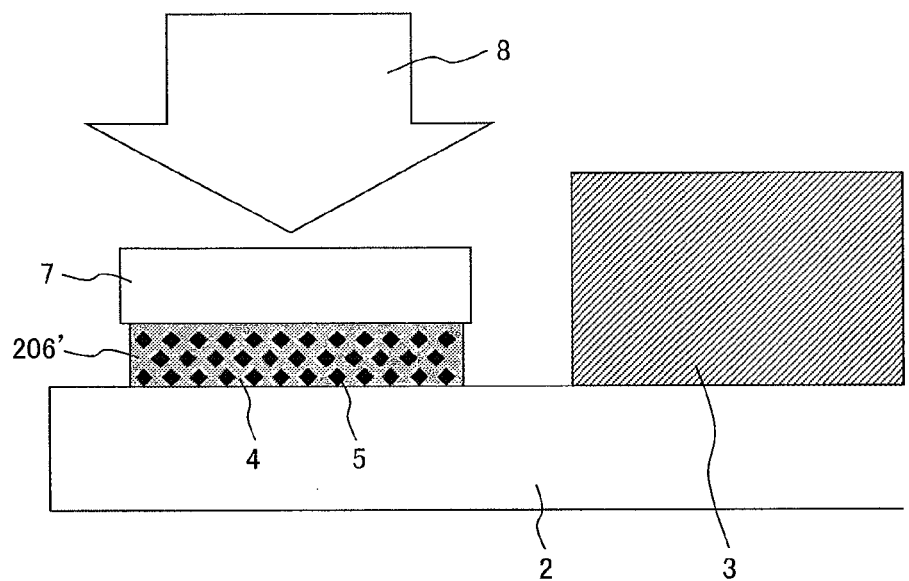
FIG. 9 is a partial sectional view illustrating the process for producing the electronic component in FIG. 2.

As illustrated in FIG. 9, the spacer 7 on which the fired sealing material 206' is located is set up onto an outer circumferential portion of the substrate 2, and then the laser 8 which has a wavelength ranging from 400 to 1100 nm is radiated across the spacer 7 to the sealing material, so that the substrates are bonded to each other. At this time, the laser 8 is radiated while the spacer 7 is pushed. In this case, the adhesiveness between the spacer 7 and the substrate 2 is improved. At the time of the radiation of the laser 8, it is necessary to pay attention not to radiate the laser 8 onto the organic member(s) 3.

Figure 10:
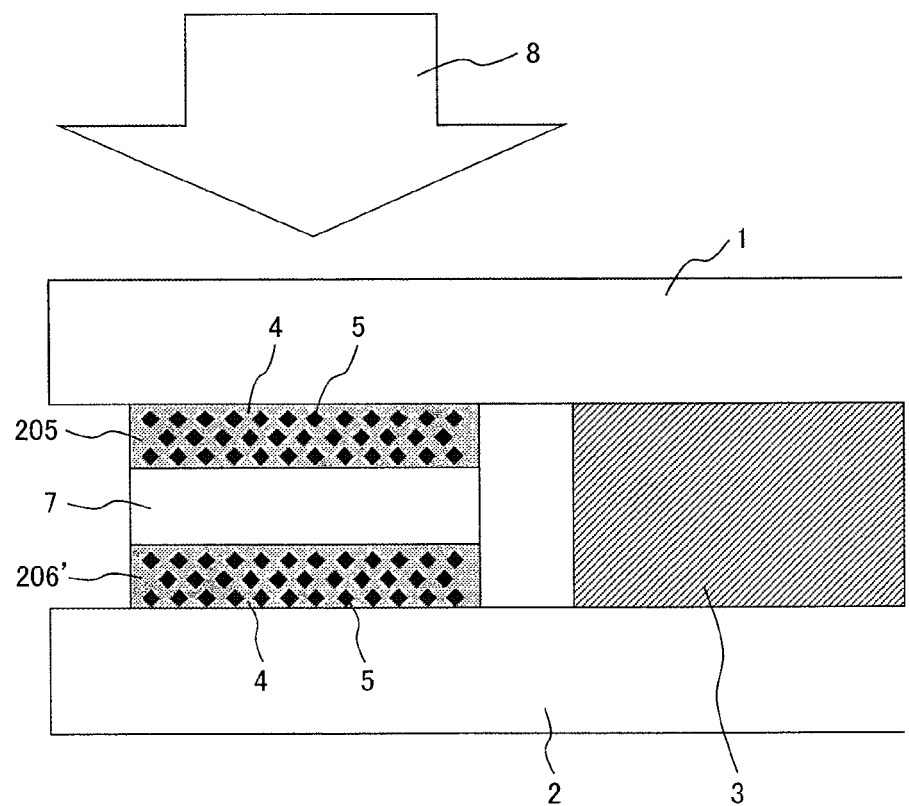
FIG. 10 is a partial sectional view illustrating the process for producing the electronic component in FIG. 2.

Next, the substrate 1 illustrated in FIG. 6 is positioned and fixed to the substrate 2, as illustrated in FIG. 10. The dried sealing material 205 is located on the substrate 1. By radiating the laser 8 across substrate 1 onto the sealing material in this state, the outer circumferential portions of the substrates 1 and 2 are bonded to each other. As far as the transparent substrate 1 and spacer 7 are low in reflectance in a wavelength range from 400 to 1100 nm, and further high in transmittance therein, these members may each be a glass substrate or resin substrate. When the substrate 2 is transparent, the laser may be radiated onto the workpiece from the substrate 2 side thereof.

As described above, an electronic component can be effectively produced without damaging any organic member (organic element or organic material) located in the electronic component according to the electronic component of the present invention, the method for producing the component, and the sealing material paste used therefor. Additionally, the present invention gives a glass bonding layer good in bonding performance, gas barrier performance (airtightness), moisture resistance, and water resistance.

Hereinafter, the present invention will be described in more detail by way of working examples thereof. However, the invention is not limited to the examples described herein. Two or more of the examples may be appropriately combined with each other.

EXAMPLE 1

In the present example, filler particles contained in a sealing material were investigated.

Table 1 shows the composition and properties of each investigated filler particle species. About the composition, a primary component, and secondary components A and B therein were determined according to X-ray diffraction. The primary component is a low thermally-expandable material. The secondary component A is an oxide containing a bivalent transition metal, and the secondary component B is one or more oxides other than the transition-metal-containing oxide. In this table, the examples F-01 to 08 are filler particles of working examples. The examples F-09 to 15 are filler particles of comparative examples. Comparative Examples F-09, 11, and 13 to 15 are ordinary filler particles that are frequently used together with a low-melting glass for a sealing material. As the comparative examples, commercially available products were used. Other filler particles were experimentally synthesized.

Examples F-01 to 05 were obtained, respectively, by charging $Zr_2(WO_4)(PO_4)_2$ particles into solutions containing Mn, Fe, Co, Ni and Cu ions, respectively, kneading the slurries, drying the slurries, firing the resultants at 800 to 1200° C., and then pulverizing the fired matters. For reference, the valence of the transition metal in each of the solutions may be, besides bivalence, for example, monovalence, trivalence or tetravalence. By firing such solutions appropriately, their transition metal was precipitated as a bivalent oxide. In the examples F-01 to 05, as their secondary components A, $MnWO_4$, $FeWO_4$, $CoWO_4$, $NiWO_4$ and $CuWO_4$ precipitated, respectively. As each of their secondary components B, $Zr_2O(PO_4)_2$ precipitated. The precipitation of the secondary component B was based on the production of the secondary component A. Before and after the pulverization, a cross section of any particle of each of the filler particle species F-01 to 05 was observed and analyzed by SEM-EDX.

Figure 11:
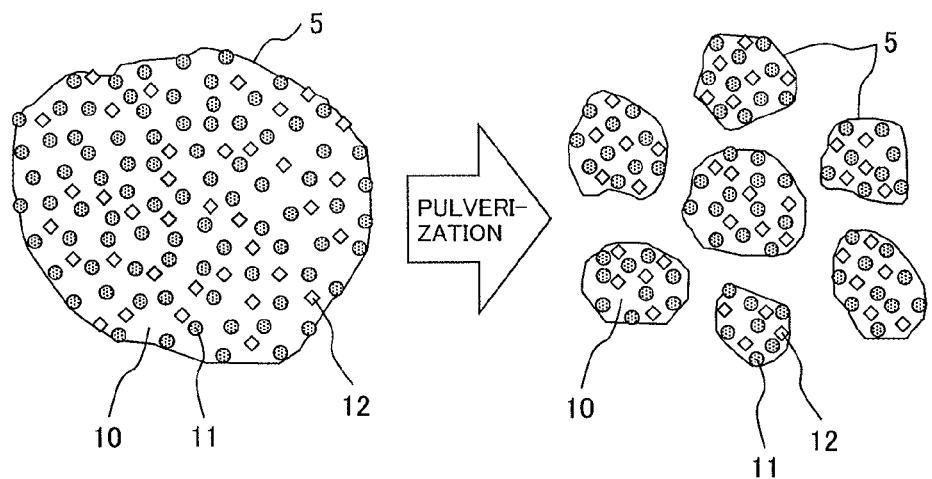
FIG. 11 is a schematic view illustrating states of a filler particle in a working example before and after the particle is pulverized.

FIG. 11 is a view showing a schematic cross section of a particle of any one of the filler particle species F-01 to 05 before and after the pulverization.

As illustrated in this figure, in the cross section of a filler particle 5, i.e., the particle of any one of the filler particle species F-01 to 05, it was understood that the secondary component A (11) and the secondary component B (12) adhered onto only the outer surface of each of the $Zr_2O(PO_4)_2$ particles which were a primary component 10, and further the secondary components A and B were dispersed also inside the particle. Thus, even when the particles were pulverized into an appropriate particle diameter after the synthesis, the individual particles were slightly varied in state and composition.

In Comparative Example F-10, $Zr_2(WO_4)(PO_4)_2$ particles were charged into a solution containing Fe ions, and the slurry was kneaded. The resultant was then dried and fired. Since the firing temperature was as low as temperatures of 500 to 600° C., a desired secondary component A did not precipitate. As a secondary component B, $Fe_2O_3$ was detected. Before and after the pulverization, a cross section of a filler particle of the filler particle species F-10 was observed and analyzed by SEM-EDX.

Figure 12:
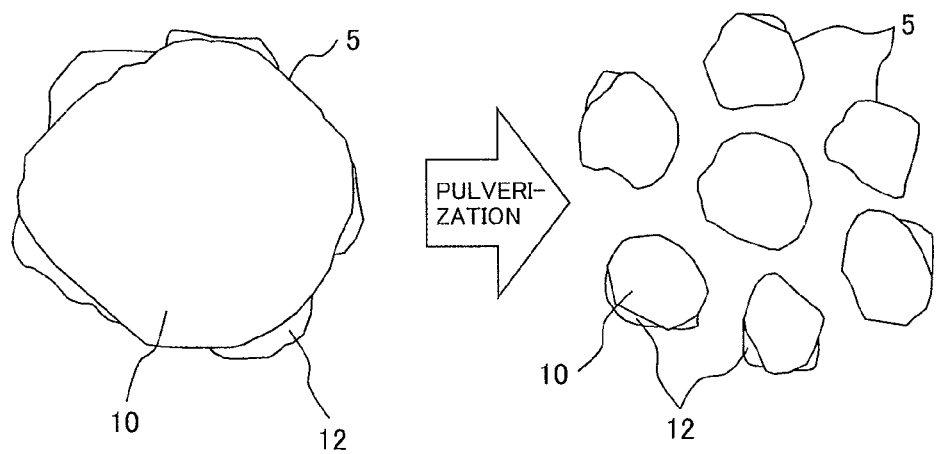
FIG. 12 is a schematic view illustrating states of a filler particle in a comparative example before and after the particle is pulverized.

FIG. 12 is a view showing the cross section of the filler particle of the filler particle species F-10 before and after the pulverization.

In this figure, the secondary component B (12) of a filler particle 5, i.e., the filler particle of the filler particle species F-10 was formed on the outer surface of the $Zr_2(WO_4)(PO_4)_2$ particle which was a primary component 10. In a case where the filler particles are in such a form, these particles do not easily give homogenous particles when pulverized. It has been understood that when the firing temperature is low, the reaction advances insufficiently so that a desired precipitation (secondary component A) is not obtained and further a secondary component B is formed on the outer surfaces of the particles.

Examples F-06 to 08 were obtained, respectively, by charging $LiAlSiO_4$, $SiO_2$ and $Mg_2Al_4Si_5O_{18}$ particles into Co-ion-containing solutions, respectively, kneading the slurries, drying the slurries, and firing the resultants at 800 to 1200° C. As their secondary component A, $CoAl_2O_4$ or $Co_2SiO_4$ precipitated. According to X-ray diffraction, no secondary component B was recognized. Also in the case of ion species other than the Co ion species, a secondary component A precipitated. Before and after the pulverization, a cross section of any particle of each of the filler particle species F-06 to 08 was observed and analyzed by SEM-EDX.

Figure 13:
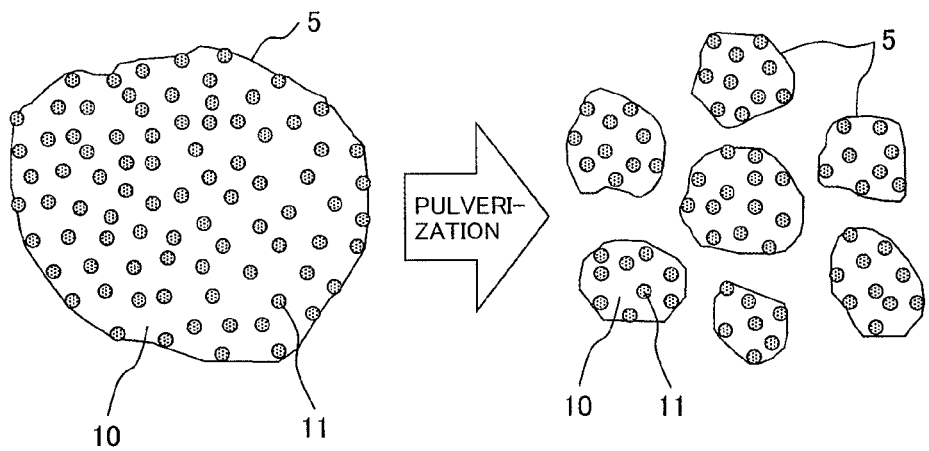
FIG. 13 is a schematic view illustrating states of a filler particle in a working example before and after the particle is pulverized.

FIG. 13 is a view showing a cross section of a particle of any one of the filler particle species F-06 to 08 before and after the pulverization.

In this figure, in the cross section of a filler particle 5, i.e., the filler particle of any one of the examples F-06 to 08, the secondary component A (11) was dispersed inside a primary component 10.

In Comparative Example F-12, $Zr_2O(PO_4)_2$ particles were charged into a solution containing Fe ions, and the slurry was kneaded. The resultant was then dried and fired at 800 to 1200° C. However, a desired secondary component A did not precipitate. It appears that when the primary component is a zirconium phosphate compound, the compound needs to contain W. As secondary components B, $FePO_4$ and $ZrO_2$ were detected. Before and after the pulverization, a cross section of a filler particle of the filler particle species F-12 was observed and analyzed by SEM-EDX.

Figure 14:
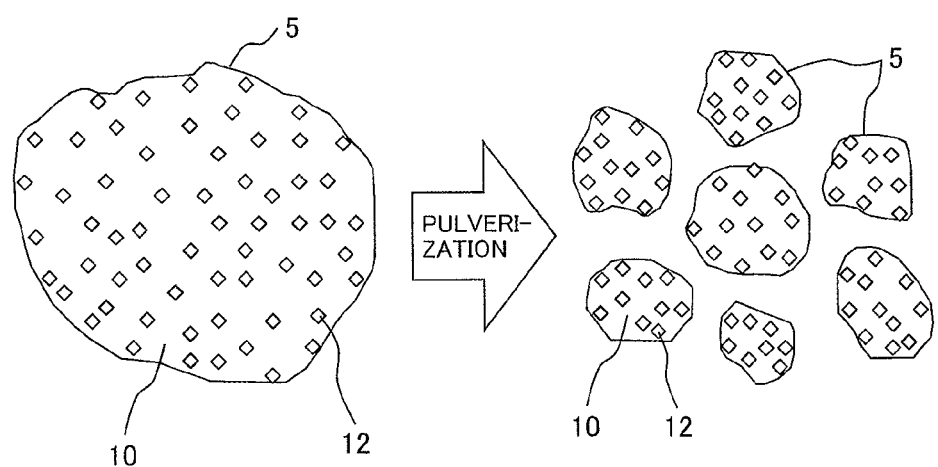
FIG. 14 is a schematic view illustrating states of a filler particle in a comparative example before and after the particle is pulverized.

FIG. 14 is a view showing the cross section of the filler particle of the filler particle species F-12 before and after the pulverization.

As illustrated in this figure, no secondary component A was detectable. However, the secondary component B (12) was dispersed in the $Zr_2O(PO_4)_2$ particles which were a primary component 10.

When each of the filler particle species was evaluated, a jet mill was used to pulverize the filler particles into an average particle diameter of 3 to 5 The thermal expansion coefficient of the filler particle species was measured by using, as a measuring sample, a rectangularly columnar sintered body (obtained therefrom) of 4×4×15 mm size and making an analysis with a thermal expansion meter. About conditions for the measurement, the temperature-raising rate was 5° C./minute in the atmospheric air. The range of the measuring temperatures was from 30 to 250° C. A standard sample used therein was a circularly columnar quartz glass piece having a size of 5 mm diameter×15 mm. Thus, an elongation percentage thereof was subtracted (from the measured value) to calculate out the thermal expansion coefficient of the filler particle species. The density of the filler paretic species was measured by using powdery particles thereof as a measuring sample, and then making an analysis of this sample with a gas-substitution type pycnometer (fixed volume expansion method).

Next, about the filler particle species F-01 to 15 shown in Table 1, the laser irradiation property thereof was evaluated. In the evaluation, Bi—B—Zn—Ba—O based low-melting glass particles which are hardly heatable by irradiation with a laser having a wavelength ranging from 400 to 1100 nm were blended into each of the filler particle species to produce pressed powder shaped bodies. The used Bi—B—Zn—Ba—O based low-melting glass particles had an average particle diameter of 2.3 μm, a density of 6.6 g/cm³, and a softening point of 445° C. The content by percentage thereof was made equal, in proportion by volume, to that of the filler particles. Each of the pressed powder shaped bodies was produced at 1 ton/cm², using a mold and a hand press. The size thereof was adjusted to a size of 20 mm diameter×2 to 3 mm.

Figure 15:
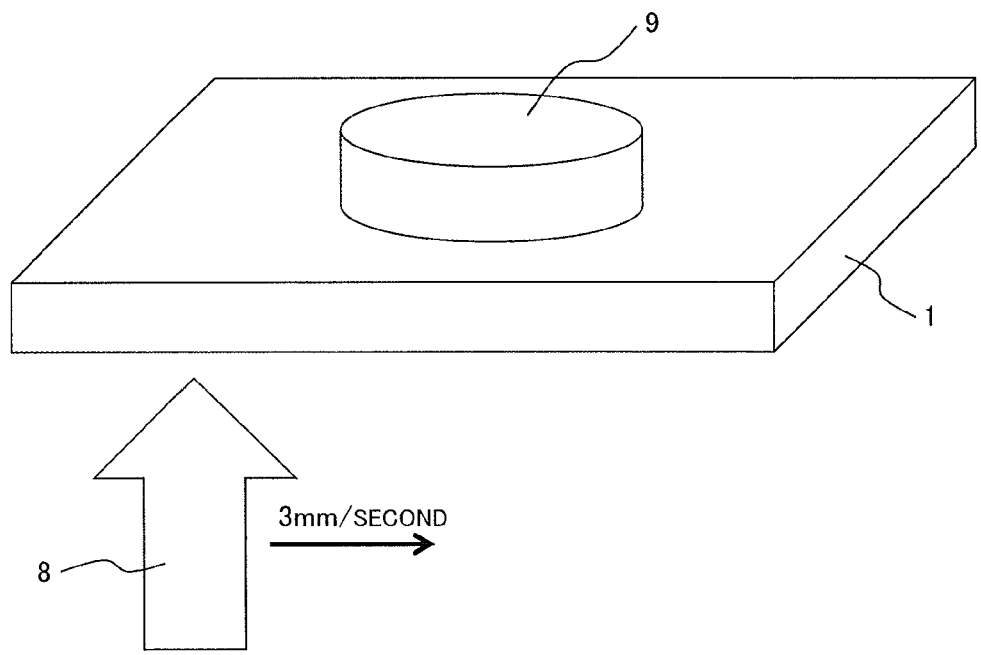
FIG. 15 is a schematic view illustrating a laser radiation experiment of a pressed powder shaped body.

FIG. 15 is a view illustrating an outline of the laser radiation experiment.

As illustrated in this figure, each of the pressed powder shaped bodies which is a body 9 was put onto a substrate 1 made of transparent quartz glass, and a laser 8 was radiated onto the pressed powder shaped body 9 from the rear side thereof while being scanned at a speed of 3 mm/second. For the laser 8, the following five species were used: a semiconductor laser of a wavelength of 405 nm; a second harmonic wave of a YAG laser of a wavelength of 532 nm; a semiconductor laser of a wavelength of 630 nm; a semiconductor laser of a wavelength of 805 nm; and a YAG laser of a wavelength of 1064 nm. The laser 8 was radiated across the substrate 1 onto the pressed powder shaped body 9, and the laser-radiated surface thereof was observed through an optical microscope. When the contained Bi—B—Zn—Ba—O based low-melting glass particles softened and flowed, the shaped body was determined to be good (circular mark). When the glass particles did not soften and flow, the shaped body was determined to be bad (cross mark). The matter that the contained Bi—B—Zn—Ba—O based low-melting glass particles softened and flowed was judged to be based on effective heating of the filler particles. Conversely, the matter that the glass particles neither softened nor flowed was judged to be based on a matter that the filler particles were not heated very much by the laser radiation.

Table 2 is a table in which the results of the filler particle species shown in Table 1 in the laser radiation experiment are collected and shown.

As shown in this table, the filler particle species of each of Examples F-01 to 08 succeeded in the softening and flowing of the contained Bi—B—Zn—Ba—O based low-melting glass particles even when the wavelength of the radiated laser was any one of the five species. However, the filler particle species of each of Comparative Examples F-09 to 15 failed in the softening and flowing of the contained Bi—B—Zn—Ba—O based low-melting glass particles even when the wavelength of the radiated laser was any one of the five species.

From the results, it was understood that the filler particle species of Examples F-01 to 08 adsorbed the laser effectively to be raised in temperature up to a high temperature. However, the filler particle species of Comparative Examples F-09 to 15 were unable to absorb the laser effectively, not to be raised in temperature up to a high temperature. Thus, the comparative examples failed to cause the contained Bi—B—Zn—Ba—O based low-melting glass particles to soften and flow.

In the filler particle species of each of Examples F-01 to 08, an oxide precipitated which contained any one of the bivalent transition metals, Mn, Fe, Co, Ni and Cu. This oxide effectively absorbed the laser to contribute to the heating of the filler particles. In the filler particle species of Examples F-01 to 05, $Zr_2O(PO_4)_2$ also precipitated since the bivalent-transition-metal-containing oxide precipitated. However, this component is not a component heatable by the laser radiation, as is understood from the filler particle species of Comparative Example F-11.

It was understood from the above that Examples F-01 to 08 were filler particle species effective for laser-sealing, in each of which the bivalent-transition-metal-containing oxide was caused to precipitate.

EXAMPLE 2

In the present example, respective low-melting glasses contained in sealing materials were initially investigated.

In Table 3 are shown the investigated low-melting glasses and properties thereof.

The low-melting glasses of Examples G-01 to 06 shown in this table are vanadic acid glasses, and those of Examples 07 to 10 are silver vanadate glasses. Both of these glass species are low-melting glass species each containing vanadium oxide. The low-melting glasses of Comparative Examples G-11 to 13 are glasses containing no vanadium oxide.

The transition point and the softening point of each of the low-melting glasses G-01 to 15 were measured by using a jet mill to pulverize the glass into an average particle diameter of 3 μm or less, and making a differential thermoanalysis (DTA) up to 500° C. at a temperature-raising rate of 5° C./minute by use of the low-melting glass particles. As a standard sample, alumina ($Al_2O_3$) particles were used.

Figure 16:
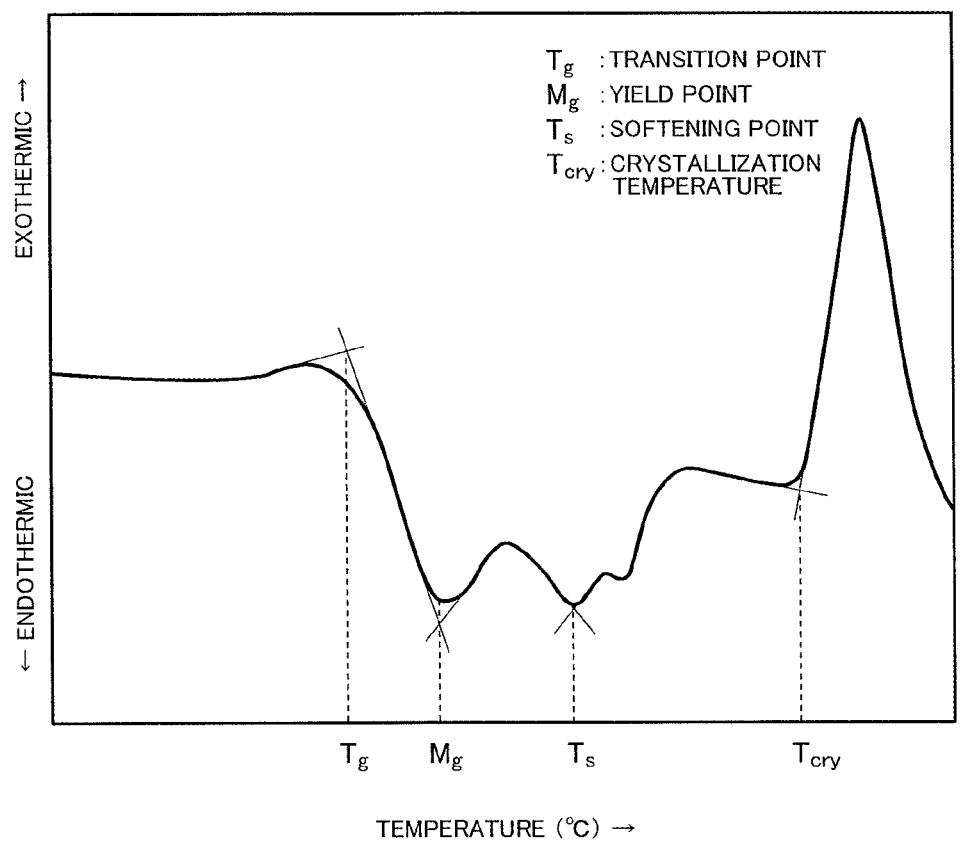
FIG. 16 is a graph showing an example of a DTA curve obtained by differential thermoanalysis (DTA) of a typical low-melting glass.

FIG. 16 shows a DTA curve of typical one of the low-melting glasses.

The transition point $T_g$ thereof is the starting temperature of a first endothermic peak; the yield point $M_g$, the temperature of the endothermic peak; the softening point $T_s$, the temperature of a second endothermic peak; and the crystallization temperature $T_{Cry}$, the starting temperature of an endothermic peak based on the crystallization. $T_g$, $M_g$ and $T_g$ are defined by the viscosity, and are said to correspond to $10^{13.3}$ poises, $10^{11.0}$ poises, and $10^{7.65}$ poises, respectively.

In order to cause any glass to soften and flow at low temperature, $T_s$ thereof needs to be made as low as possible. In order to relieve a thermal remaining strain therein, $T_g$ also needs to be made as low as possible. $T_{Cry}$ is the temperature at which the glass starts to be crystallized. The crystallization hinders the softening fluidity of the glass; thus, it is preferred to make $T_{Cry}$ higher than $T_3$ as much as possible. In Examples G-07 to 10 and Comparative Example G-13 each containing silver (Ag) ions, $T_g$ and $T_s$ were each remarkably lower than in the other working examples and the comparative examples.

The thermal expansion coefficient of each of the examples G-01 to 15 was measured by cutting out a rectangular column of 4×4×15 mm size from a block of the glass from which any thermal strain was removed, working the block, and then using the resultant sample to make a measurement with a thermal expansion meter. The temperature-raising rate was set to 5° C./minute, and as a standard sample, a quartz glass piece was used which was in the form of a circular column having a size of 5 mm diameter×15 mm.

Figure 17:
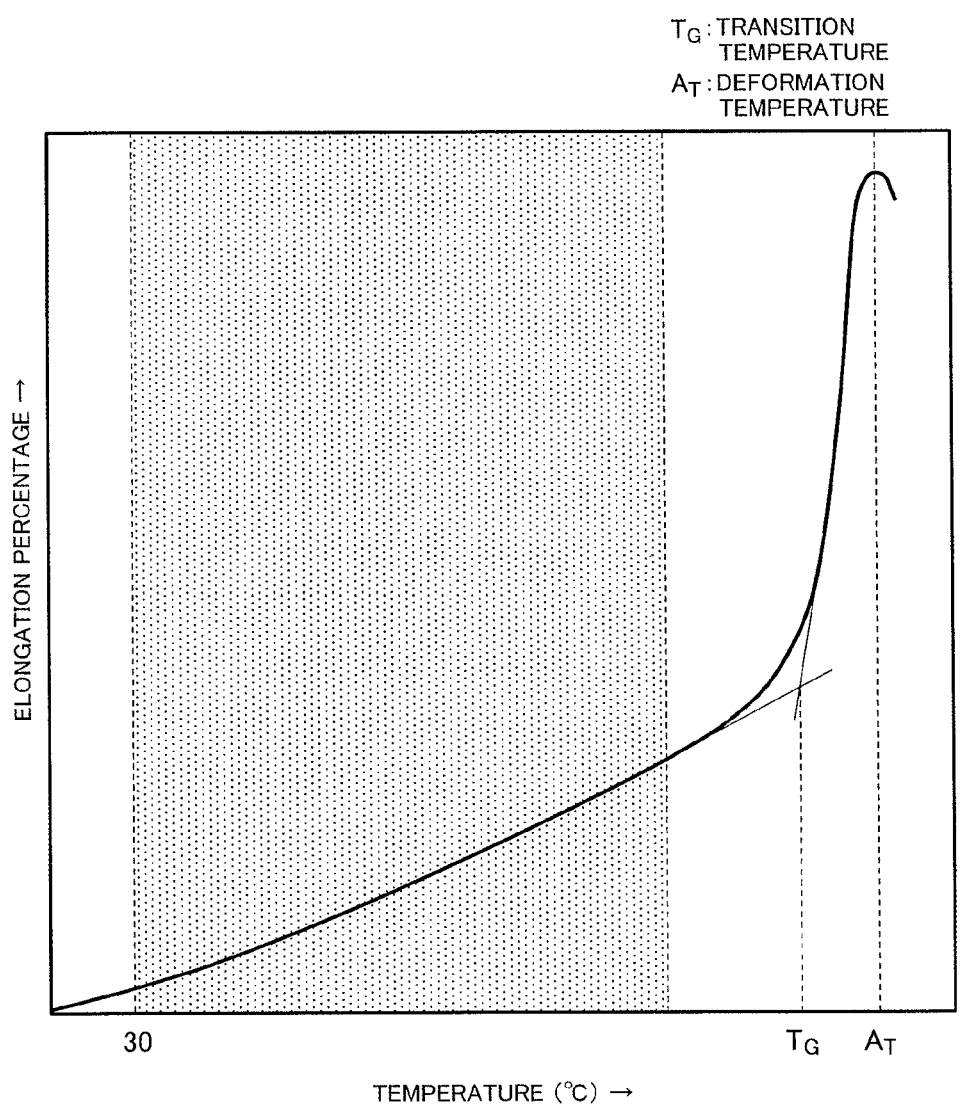
FIG. 17 is a graph showing an example of a thermal expansion curve of a typical low-melting glass.

FIG. 17 shows a thermal expansion curve of typical one of the low-melting glasses. In this graph, the elongation quantity of the quartz glass piece as the standard sample was subtracted (from the resultant actual value). Any glass is elongated as heated. The temperature at which the elongation becomes remarkably large is the transition temperature $T_G$. Thereafter, the elongation is apparently terminated. This temperature is the deformation temperature $A_T$. $A_T$ is the temperature at which the glass is deformed by load. $T_G$ is measured as a temperature slightly higher than $T_g$ according to the above-mentioned analysis DTA. $A_T$ is a middle temperature between $M_g$ and $T_s$ according to the analysis DTA.

The thermal expansion coefficient of any glass is measured from the gradient of the elongation quantity in the range of temperatures lower than $T_G$. In Examples G-01 to 06 and Comparative Examples 11 and 12, the thermal expansion coefficient was measured from the gradient of the elongation quantity in a temperature range of 30 to 250° C. In Examples G-07 to 10 and Comparative Example G-13 the thermal expansion coefficient was measured from the gradient of the elongation quantity in a temperature range of 30 to 150° C., $T_G$ being low in each of these Examples and Comparative Example. In Examples G-03 and G-07 to 10, and Comparative Example G-13 which contained monovalent cations of potassium (K) or silver (Ag), the thermal expansion coefficient was $150 \times 10^{-7}$/° C. or more to be far larger than that in the other working examples and comparative examples.

The density of each of the examples G-01 to 15 was measured by using the same powder particles as used in the DTA, and using a gas-substitution type pycnometer (fixed volume expansion method) in the same manner as used for the filler particles. In Examples G-07 to 10, and Comparative Example G-13 which each contained silver (Ag) ions, and Comparative Example G-11 which contained bismuth (Bi) ions, the density was 5 g/cm³ or more to be larger than that in the other working examples and comparative examples.

The softening fluidity of each of the examples G-01 to 15 through the laser radiation was evaluated by using the same powder particles as used to measure the DTA or the density to be produced into pressed powder shaped bodies each having a size of 20 mm diameter×2 to 3 mm by means of a hand press (1 ton/cm²), and then radiating a laser as has been illustrated in FIG. 15 thereto. The used laser, conditions for the radiation, and a method for the evaluation were according to those in EXAMPLE 1. When the low-melting glass particles (of any one of the shaped bodies, i.e., the samples) softened and flowed, the sample was determined to be good (circular mark). When the particles did not soften and flow, the sample was determined to be bad (cross mark). As shown in Table 3, Examples G-01 to 10 showed a good softening fluidity even when any one of the laser species was radiated thereonto.

This is because these examples contained vanadium oxide, thereby absorbing the various laser species, the wavelengths of which ranged from 400 to 1100 nm, so as to be heated. However, Comparative Examples G-11 to 13 which were each a low-melting glass containing no vanadium oxide did not show a good softening fluidity even when any one of the laser species was radiated thereonto. From this matter, a low-melting glass containing vanadium oxide is effective for laser sealing.

Next, an investigation was made about combinations of a low-melting glass contained in a sealing material with filler particles.

The used low-melting glass was each of Examples G-01 to 10 and Comparative Examples G-11 to 13 shown in Table 3. The average particle diameter of these glasses was adjusted to 3 μm or less by pulverizing the glasses in jet mills. The used filler particles were particles of each of Examples F-01 to 08 and Comparative Examples F-09 to 15 shown in Table 1. The average particle diameter of these particles was adjusted to about 3 μm or less by pulverizing the particles in jet mills.

The average particle diameter of filler particles (in the present invention) is preferably from about 2 to 5 μm, which is dependent on the thickness of a film obtained after the particle-containing paste is fired. When the average particle diameter is set to 2 μm or more, the paste can exhibit a thermal-expansion reduction effect. Conversely, by setting the diameter to 5 μm or less, the following is not easily caused when the paste is painted onto a substrate by a screen printing or dispenser method: the screen is clogged or the nozzle is stopped. Moreover, after the firing, a smooth fired film is obtained, and thus subsequent laser sealing gives a good bonding strength. The average particle diameter is in particular preferably about 3 μm. The diameter of the low-melting glass particles is more preferred as the diameter is smaller. However, considering the yield of the glass particles when the starting glass is pulverized, the particle diameter is desirably from about 1 to 5 μm, in particular effectively from 1 to 3 μm.

Sealing material pastes were produced which each contained one of the filler particle species in Table 1, one of the low-melting glass species in Table 3, and an organic solvent. The content of the filler particle species was set to 50 parts by volume for 100 parts by volume of the low-melting glass species. In the case of using the vanadic acid low-melting glasses of Examples G-01 to 06 and the low-melting glass of Comparative Example G-13, butyl carbitol acetate was used as the organic solvent. In the case of using the vanadic acid low-melting glasses of Examples G-01, 02, 05 and 06, ethyl cellulose was used as an organic resin binder. In the case of using the vanadic acid low-melting glasses of Examples G-03 and 04, and the low-melting glass of Comparative Example G-13, nitrocellulose was used as an organic resin binder. In the case of using the silver vanadate low-melting glasses of Examples G-07 to 10, only α-terpineol high in viscosity was used as the organic solvent without using any organic resin binder to produce some of the above-mentioned sealing material pastes. In the case of using the low-melting glasses of Comparative Examples G-11 and 12, α-terpineol was used as the organic solvent and ethyl cellulose was used as an organic resin binder to produce some of the sealing material pastes.

The produced sealing material pastes were pastes produced using all combinations of the filler particle species in Table 1 with the low-melting glass particle species in Table 3.

Figure 18:
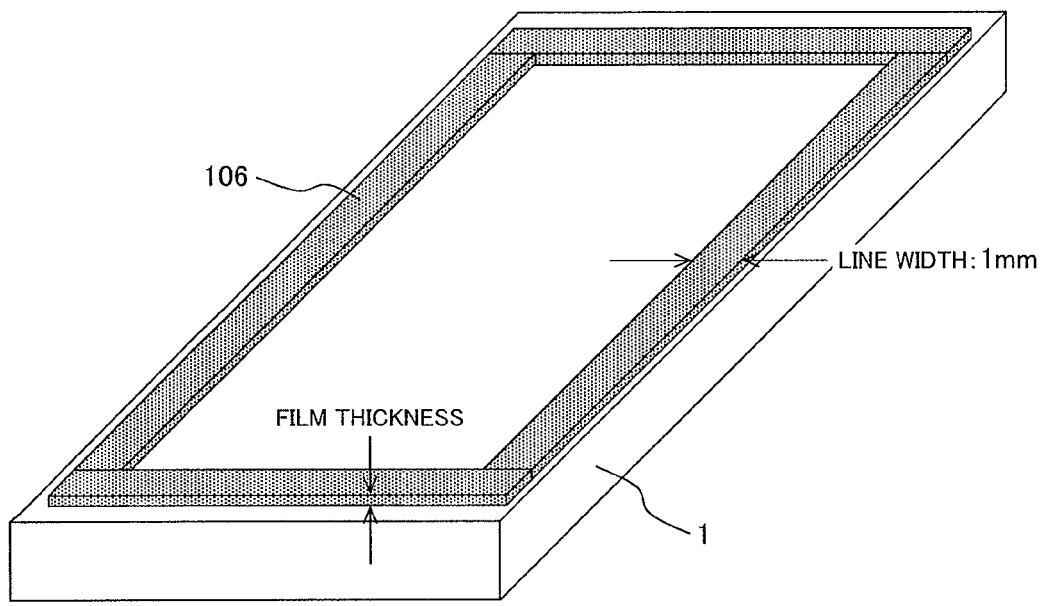
FIG. 18 is a schematic perspective view illustrating a state that a sealing material paste is painted.

FIG. 18 illustrates a state that any one of the sealing material pastes was painted.

As illustrated in this figure, a dispenser method was used to paint each of the sealing material pastes onto an outer circumferential portion of a transparent substrate 1 (slide glass piece), and the workpiece was dried. Thereafter, the workpiece was fired at a temperature 30 to 60° C. higher than the $T_s$ of the low-melting glass used in each of the pastes. For a fired sealing material 106 formed on the substrate 1, the paste-painted amount was adjusted to set the line width to 1 mm and set the film thickness into the range of 10 to 15 μm after the paste would be fired.

The following will describe evaluation of the bonding performance (of each of the sealing materials) through laser radiation.

Figure 19:
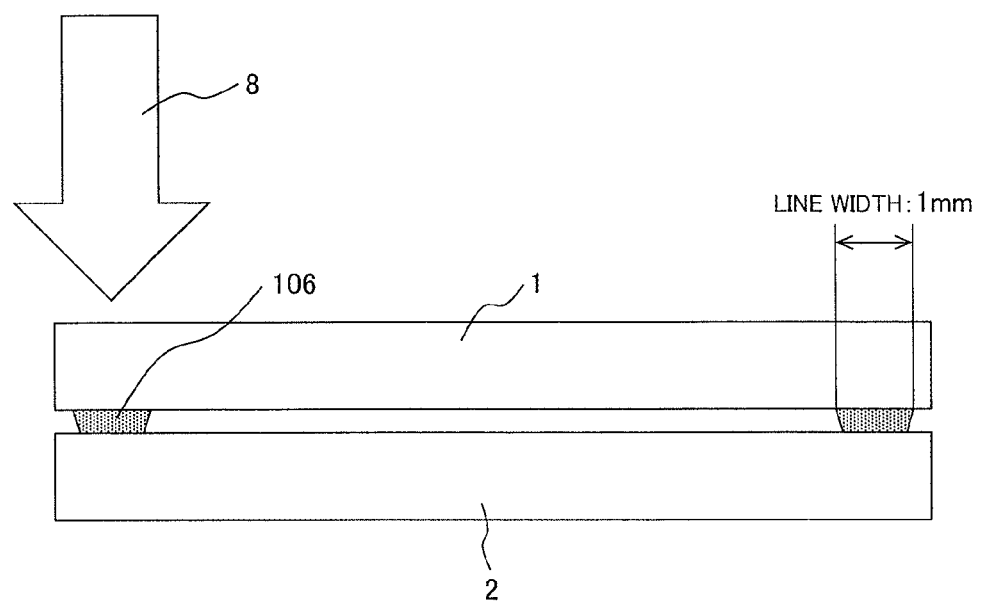
FIG. 19 is a schematic sectional view illustrating a state of laser radiation.

FIG. 19 illustrates a state of the laser radiation.

In FIG. 19, the substrate 1 illustrated in FIG. 18, having the fired sealing material 106, was set to face a substrate 2 made of alumina ($Al_2O_3$). While a laser 8 was shifted at each of speeds of 10 mm/second, 20 mm/second and 30 mm/second, the laser 8 was radiated to the fired sealing material 106 from the substrate-1-side of the workpiece to bond the respective outer circumferential portions of the substrates 1 and 2 to each other. The used laser 8 was a semiconductor laser having a wavelength of 805 nm. In the case of each of the speeds, the bonding performance of the sealing material was evaluated.

Results of the evaluation are shown in Table 4. The evaluation of the bonding performance was made through a helium leakage test. When a leakage was caused, the sample was judged to be "good (circular mark)"; when a slow leakage was caused, the sample to be "fair (triangular mark)"; and when a leakage was easily caused, the sample to be "bad (cross mark)".

From this table, it is understood that individual combinations between the filler particle species of Examples F-01 to 08 and the low-melting glass species of Examples G-01 to 10 are good in bonding performance in laser sealing. In other words, about laser sealing, it is understood that preferred is a combination of a filler particle species in which an oxide containing a bivalent transition metal is precipitated with a low-melting glass species containing vanadium oxide.

Examples of the bivalent transition metal used in the filler particles are Mn, Fe, Co, Ni, and Cu. Particularly effective are $Zr_2(WO_4)(PO_4)_2$ particles (Examples F-01 to 05) in which one or more selected from $MnWO_4$, $FeWO_4$, $CoWO_4$, $NiWO_4$, and $CuWO_4$ precipitate. Out of the low-melting glasses, effective are the oxide glasses containing V, Te, Fe and P (Examples 0-04 to 06) and the oxide glasses containing V, Ag and Te (Examples G-07 to 10). The transition point and the softening point of the former are 350° C. or lower, and 410° C. or lower, respectively. The points of the latter are 240° C. or lower, and 300° C. or lower, respectively.

From the above, it has been understood that when both of a low-melting glass and a filler particle species are effectively heated, the sealing material can be largely improved in softening fluidity through laser radiation to make it possible to make the scanning speed of the laser remarkably large. This matter contributes greatly to an improvement of electronic components in productivity, and a decrease in thermal damage to the inside of the electronic components.

EXAMPLE 3

In the present example, concerning a filler particle species composed of $Zr_2(WO_4)(PO_4)_2$, $FeWO_4$, and $Zr_2O(PO_4)_2$, an investigation was made about effects of the content by percentage of $Zr_2(WO_4)(PO_4)_2$ as a primary component onto the thermal expansion coefficient, and the laser irradiation property of the species.

A predetermined amount of $Zr_2(WO_4)(PO_4)_2$ particles was charged into each of eight solutions in which the concentration of Fe ions was varied, and the resultants were kneaded, dried, and then fired at about 1000° C. to produce eight filler particle species different from each other in $Zr_2(WO_4)(PO_4)_2$ content by percentage.

It was verified according to X-ray diffraction that each of the filler particle species was composed of $Zr_2(WO_4)(PO_4)_2$, $FeWO_4$, and $Zr_2O(PO_4)_2$. It was also verified according to SEM-EDX that $FeWO_4$, and $Zr_2O(PO_4)_2$ precipitated substantially evenly in the $Zr_2(WO_4)(PO_4)_2$ particles in the same manner as has been illustrated in FIG. 11. The respective contents by percentage of $Zr_2(WO_4)(PO_4)_2$ in the eight produced filler particle species were 67, 72, 76, 81, 84, 90, 94 and 98% by mass. In the same way as in EXAMPLE 1, the respective thermal expansion coefficients were measured.

Figure 20:
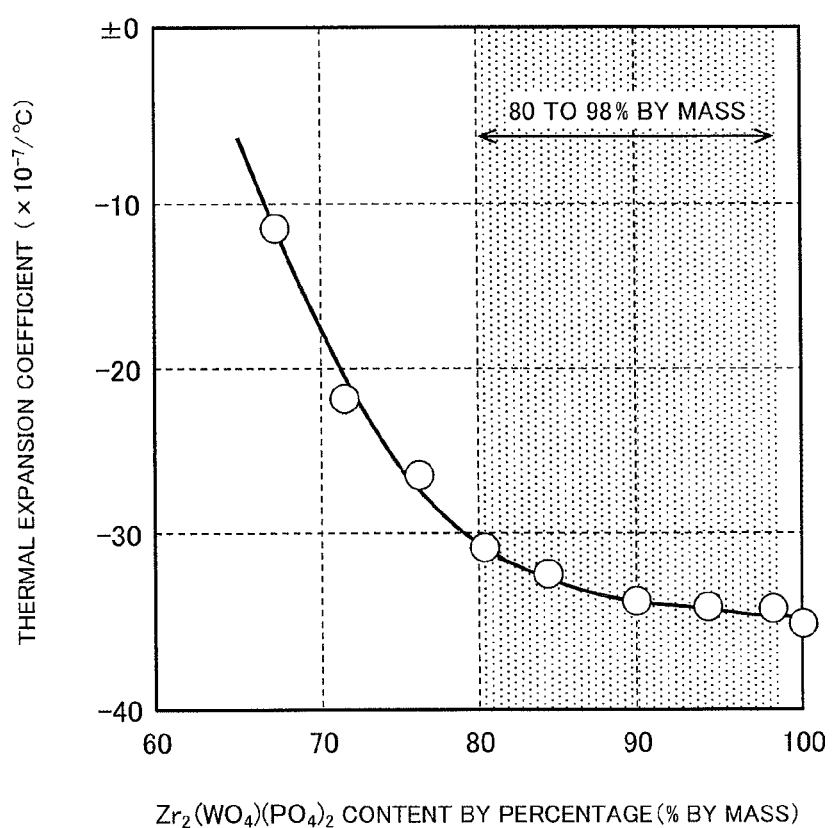
FIG. 20 is a graph showing a relationship between the content by percentage of $Zr_2(WO_4)(PO_4)_2$ in filler particles, and the thermal expansion coefficient thereof.

FIG. 20 shows a relationship between the content by percentage of $Zr_2(WO_4)(PO_4)_2$ and the thermal expansion coefficient. As the thermal expansion coefficient of a species in which the content by percentage of $Zr_2(WO_4)(PO_4)_2$ was 100% by mass, a data on Comparative Example F-09 in Table 1 was used.

It is understood from this figure that as the content by percentage of $Zr_2(WO_4)(PO_4)_2$ is larger, the thermal expansion coefficient is smaller, and for the filler particles the content by percentage of $Zr_2(WO_4)(PO_4)_2$ is preferably 80% or more by mass, and is in particular effective 90% or more by mass. As the content by percentage of $Zr_2(WO_4)(PO_4)_2$ increases, the thermal expansion coefficient does not linearly become smaller. A cause therefor would be the size of precipitating particles of $FeWO_4$ and $Zr_2O(PO_4)_2$. The following is presumed: when the content by percentage of $Zr_2(WO_4)(PO_4)_2$ is large, the size of the precipitating particles of $FeWO_4$ and $Zr_2O(PO_4)_2$ is small not to affect the thermal expansion coefficient of the filler particles largely; however, as the content by percentage of $Zr_2(WO_4)(PO_4)_2$ is made smaller, the size of the precipitating particles easily becomes larger to affect the thermal expansion coefficient largely; consequently, the thermal expansion coefficient of the filler particles unfavorably becomes remarkably large.

Next, in the same way as in EXAMPLE 1, the five laser species were used to make a radiation experiment. When the content by percentage of $Zr_2(WO_4)(PO_4)_2$ was 100% by mass, the paste failed to be heated up to high temperature by irradiation with any one of the laser species, as has been described in EXAMPLE 1, so that the contained Bi—B—Zn—Ba—O based low-melting glass particles failed to be caused to soften and flow. About each of the eight produced filler particle species, it was understood that the contained Bi—B—Zn—Ba—O based low-melting glass particles were good in softening fluidity even when any one of the laser species was radiated thereto, and a large advantageous effect was gained even when the precipitation amount of $FeWO_4$ was small. Considering both of the thermal expansion coefficient and the laser irradiation property of the filler particles, the content by percentage of $Zr_2(WO_4)(PO_4)_2$ is preferably from 80 to 98% by mass.

EXAMPLE 4

In the present example, an investigation was made about the content of filler particles contained in a sealing material. The species of the used filler particles was Example F-02 in Table 1. As a low-melting glass, Example G-10 in Table 3 was used. In accordance with the manner in EXAMPLE 2, the content by percentage of each of these components was varied to produce six sealing material pastes, using α-terpineol as an organic solvent. The respective contents of the filler particle species of Example F-02 were set to 10, 30, 50, 75, 100 and 125 parts by volume for 100 parts by mass of the low-melting glass of Example G-10. In the same way as in EXAMPLE 2, a laser sealing experiment illustrated in FIGS. 18 and 19 was made.

In (each sample of) the present example, a slide glass piece was used as each of a substrate 1 and a substrate 2. Each of the six produced sealing material pastes was painted into a line width of 1 mm onto an outer circumferential portion of the substrate 1 by a dispenser method. The painted amount was adjusted to set the film thickness of the paste to about 15 μm after the paste would be fired. The sealing material paste painted on the substrate 1 was dried, and then a semiconductor laser having a wavelength of 805 nm was radiated onto the dry painted film from the rear side of the substrate 1 while the laser was shifted at a shift speed of 15 mm/second. In this way, the paste was fired. Thereafter, the substrate 2 was arranged to face the substrate 1. A semiconductor laser having a wavelength of 805 nm was radiated onto the workpiece from the substrate-1-side thereof while the laser was shifted at a shift speed of 12 mm/second. In this way, the substrates 1 and 2 were bonded to each other. From the substrate-2-side of the resultant, the bonding portion was observed through an optical microscope to evaluate the adhesiveness therebetween.

When the filler particle content was from 10 to 100 parts by volume, the contained low-melting glass softened and flowed satisfactorily so that the substrates were evenly bonded closely to each other. However, when the filler particle content was 125 parts by volume, an even and close adhesion failed. This is because the content by percentage of the filler particles was larger than that of the low-melting glass so that the low-melting glass which had a function of bonding and fixing the substrates 1 and 2 to each other was small in quantity. In such a case, a good bonding strength cannot be obtained. In the meantime, when the content of the filler particles was less than 10 parts by volume, the paste did not obtain a thermal-expansion reduction effect very much. Thus, it has been understood that the content of the filler particles is preferably from 10 to 100 parts by volume for 100 parts by volume of the low-melting glass.

EXAMPLE 5

In the present example, an investigation was made about the film thickness of a sealing material containing filler particles according to the present invention and a low-melting glass. A sealing material paste was produced, using Example F-02 in Table 1 as the filler particles, Example G-05 in Table 3 as the low-melting glass, butyl carbitol acetate as an organic solvent, and ethyl cellulose as an organic resin binder. The content of the filler particles F-02 was set to 40 parts by volume for 100 parts by volume of the low-melting glass G-06. In the same way as in EXAMPLE 2, a laser sealing experiment illustrated in FIGS. 18 and 19 was made.

In (each sample of) the present example, a non-alkali borosilicate glass piece was used as each of a substrate 1 and a substrate 2. The produced sealing material paste was painted into a line width of 1 mm onto an outer circumferential portion of the substrate 1 by a dispenser method. The paste-painted amount was adjusted to set each of about 5, 10, 15, 20, 30, and 40 μm after the paste would be fired. The sealing material paste painted on the substrate 1 was dried and then fired at 420° C. Thereafter, the substrate 2 was arranged to face the substrate 1. A semiconductor laser 8 was radiated onto the workpiece from the substrate-1-side thereof while the laser was shifted at a shift speed of 15 mm/second. In this way, the outer circumferential portions of the substrates 1 and 2 were bonded to each other. For the laser 8, the five laser species used in Example 1 were used.

When the fired film thickness was 20 μm or less, the substrates succeeded in being strongly bonded to each other even when any one of the laser species was used. However, when the fired film thickness was about 40 μm, the fired film was easily peeled from the surface of the substrate 2 even when any one of the laser species was used. When the fired film thickness was about 30 μm, the bonding was attained according to the second harmony wave of the YAG laser of 532 nm wavelength, and the YAG laser of 1064 nm wavelength. However, the fired film was easily peeled from the surface of the substrate 2 according to each of the semiconductor lasers having respective wavelengths of 405 nm, 630 nm and 805 nm. This was not caused by the varied wavelengths but caused by a matter that the YAG lasers were higher in power than the semiconductor lasers. Semiconductor lasers are far lower in costs than YAG lasers. Thus, for laser sealing, it is more desirable to use a semiconductor laser. The thickness of the bonding layer is preferably 20 μm or less.

Next, in each of the same cases where the film had easily been peeled, i.e., in each case where the fired painted film was as thick as about 40 lasers were radiated thereto through both surfaces of substrates 1 and 2, respectively. Even when any one of the laser species was used, the substrates succeeded in being strongly bonded to each other. Such a method may cope with cases where such a bonding layer is thick.

EXAMPLE 6

In the present example, a transparent polycarbonate substrate was used as a substrate 1 in FIGS. 18 and 19, and a glass epoxy resin substrate was used as a substrate 2 therein to make a laser sealing experiment. Example F-02 in Table 1 was used as filler particles; Example G-07 in Table 3, as a low-melting glass; and α-terpineol, as an organic solvent. In this way, a sealing material paste was produced in the same way as in EXAMPLE 2. The content of the filler particles F-02 was set to 60 parts by volume for 100 parts by volume of the low-melting glass G-06.

The produced sealing material paste was painted into a line width of 1 mm onto an outer circumstantial portion of the substrate 1 by a screen printing method. The paste-painted amount was adjusted to set the film thickness into the range of 5 to 10 μm after the paste would be fired. The sealing material paste painted on the substrate 1 was dried, and then a semiconductor laser having a wavelength of 805 nm was radiated onto the dry painted film from the rear side of the substrate 1 while the laser was shifted at a shift speed of 20 mm/second. In this way, the paste was fired. Thereafter, the substrate 2 was arranged to face the substrate 1. A semiconductor laser having a wavelength of 805 nm was radiated onto the workpiece from the substrate-1-side thereof while the laser was shifted at a shift speed of 20 mm/second. In this way, the substrates 1 and 2 were bonded to each other. The state of the bonding was strong. Other than the resin used in the present example may be used.

EXAMPLE 7

When the interval between the substrates 1 and 2 was 100 µm or more, the substrates did not obtain a good adhesiveness therebetween even when lasers were radiated thereto from both surfaces thereof, respectively, by the method described in EXAMPLE 5. Thus, a substrate 1 and a substrate 2 were bonded to each other to interpose a spacer 7 therebetween in (each sample of) the present example, as has been illustrated in FIG. 2. In (the sample of) the present example, a white glass plate was used as each of the substrates 1 and 2, and the spacer 7. The outer circumferential portions of the substrates 1 and 2 were bonded to each other according to the production method illustrated in FIGS. 6 to 10.

In the same manner as in EXAMPLE 5, a sealing material paste was used which contained 100 parts by volume of the low-melting glass particles of Example G-05 shown in Table 3, 40 parts by volume of the filler particles of Example F-02 shown in Table 1, butyl carbitol acetate (an organic solvent), and ethyl cellulose (an organic resin binder). As has been illustrated in FIGS. 6 and 7, the paste was painted onto the substrate 1 and the spacer 7 (in each of the samples). After dried, the workpiece was fired at 420° C. The thickness of each of the respective resultant films (in the samples) made from the sealing material after the firing of the material was about 15 The width of the spacers 7 was fixed to 3 mm, and the respective thicknesses of the spacers were set to 70, 320, 500, and 1000 µm. The respective thicknesses of the spacers 7 plus the thickness of the sealing material were about 100, 350, 530, and 1030 µm.

As has been illustrated in FIG. 9, each of the spacers 7 was set to the outer circumferential portion around four sides of any one of the substrates 2 produced as has been illustrated in FIG. 8, and a semiconductor laser 8 having a wavelength of 630 nm was radiated onto the workpiece from the spacer-7-side thereof while the laser was shifted at a shift speed of 10 mm/second. In this way, the spacer 7 was bonded to the substrate 2. Next, one of the substrates 1 produced as has been illustrated in FIG. 3 was arranged to face the substrate 2 as has been illustrated in FIG. 10. A semiconductor laser 8 having a wavelength of 630 nm was radiated onto the workpiece from the substrate-1-side thereof while the laser was shifted at a shift speed of 15 mm/second. In this way, the substrates 1 and 2 were bonded to each other to interpose the spacer 7 therebetween. The adhesiveness thereof was evaluated. As a result, a good adhesiveness was obtained even when any one of the spacers having the varied thicknesses was used. It has been understood that when the interval between substrates 1 and 2 is large, it is effective to make use of a spacer 7 therebetween.

EXAMPLE 8

In the present example, a display having therein many organic light emitting diodes (OLEDs) was produced and evaluated. This OLED display has a structure illustrated in FIG. 1. The OLEDs which are organic elements 3 located therein are easily deteriorated by water or oxygen. It is therefore very effective to bond outer circumferential portions of substrates 1 and 2 airtightly and strongly to each other through a bonding portion 6 containing filler particles 5 and a low-melting glass 4.

In the present example, a transparent non-alkali borosilicate glass piece usable for liquid crystal displays was used as each of the substrates 1 and 2. A sealing material paste was used which contained the filler particles of Example F-02 shown in Table 1, the low-melting glass particles of Example G-05 shown in Table 3, butyl carbitol acetate (an organic solvent), and ethyl cellulose (an organic resin binder). This paste was painted onto the outer circumferential portion of the substrate 1 by a screen printing method as has been illustrated in FIG. 3. The workpiece was dried and then fired at 420° C. to form a sealing material 106 onto the outer circumferential portion. The content of the filler particles was set to 45 parts by volume for 100 parts by volume of the low-melting glass. The formation of the fired sealing material 106 was attained to have a width of about 1.5 mm and a fired film thickness of about 10 µm.

Many OLEDs corresponding to the number of pixels were formed onto the substrate 2, as has been illustrated in FIG. 4. As has been illustrated in FIG. 5, the substrate 2 and the substrate 1 were arranged oppositely to each other. A laser 8 was radiated onto the fired sealing material 106 from the substrate-1-side of the workpiece. The used laser 8 was a semiconductor laser having a wavelength of 805 nm, and was shifted at a speed of 20 mm/second along the outer circumferential portions to bond the outer circumferential portions of the substrates 1 and 2 to each other. Just after the production, a lighting-on test was made about the OLED display. As a result, it was verified that the display lighted on without any problem. Moreover, the bonding portion was good in bonding performance.

Next, this display was subjected to a high-temperature and high-humidity test under a condition of 85° C./85% Rh for 1000 hours, and a lighting-on test was made. For comparison, a display in which substrates were bonded through a resin was also put into the same environment. About this resin bonding layer, the width and the thickness were set to about 1.8 mm and about 10 respectively, and further a drying agent was set inside the display. After the high-temperature and high-humidity test, the OLED displays were each lighted on. As a result, the resin-bonded display was recognized to be largely deteriorated. This is because water or oxygen was introduced through the resin bonding portion to the inside of the display so that the OLEDs were deteriorated. However, about the display of the present example, the OLEDs were not recognized to be deteriorated in lightening-state. Thus, the test result was good. This is a result suggesting that a good airtightness was kept. Furthermore, the bonding strength of the bonding portion of the example was also evaluated after the high-temperature and high-humidity. As a result, a large decline as seen in the resin-bonded display was not recognized, so that the bonding strength was substantially equal to that before the test.

From the above, it has been understood that the present invention is effectively applicable to OLED displays. Of course, the invention can be developed to electronic components such as lighting equipment in which an OLED is mounted.

EXAMPLE 9

In the present example, a colorant-sensitized type solar battery having therein an organic colorant was produced and evaluated. In such a solar battery, molecules of an organic colorant are generally produced on surfaces of many titania ($TiO_2$) nanoparticles. When light is radiated onto the colorant, excited electrons are injected into $TiO_2$ so that while the electrons diffuse inside the nanoparticles, the electrons reach one of the electrodes. In the other electrode, i.e., the counter electrode, electrons are injected to the electrolyte, so that iodine (I) is reduced. In this way, electric power can be generated. Any colorant-sensitized type solar battery is used in a non-vacuum, and is produced in a low-temperature process without using silicon. Thus, the solar battery is effective for a decrease in costs. However, the solar battery has a large problem about reliability. In order to improve the reliability, sealing technique is very important. An organic colorant and an electrolyte each low in heat resistance are used therein. Accordingly, sealing needs to be conducted at a low temperature that is equal to or lower than the heat-resistant temperature of these substances, and thus sealing using resin is generally conducted. However, the resin sealing has a problem that a long-term reliability cannot be ensured.

An attempt was made for applying the present invention to a colorant-sensitized solar battery in the same manner as in Example 8. As each of its substrates 1 and 2, a white glass plate high in transmittance was used. A sealing material paste was used which contained the filler particles of Example F-02 shown in Table 1, the low-melting glass particles of Example G-09 shown in Table 3, and α-terpionel (an organic solvent). This paste was painted onto an outer circumferential portion of the substrate 1 by a dispenser method as has been illustrated in FIG. 3, and the workpiece was dried and then fired at 340° C. to form a sealing material 106 onto the outer circumferential portion. The content of the filler particles was set to 40 parts by volume for 100 parts by volume of the low-melting glass. The formation of the fired sealing material 106 was attained to have a width of about 1.7 mm and a fired film thickness of about 10 μm.

As has been illustrated in FIG. 4, a cell having therein many organic colorant molecules was formed or set. As has been illustrated in FIG. 5, the substrate 2 and the substrate 1 were arranged oppositely to each other. A laser 8 was radiated onto the fired sealing material 106 from the substrate-1-side of the workpiece. In the same manner as in Example 8, the used laser 8 was a semiconductor laser having a wavelength of 805 nm, and was shifted at a speed of 20 mm/second along the outer circumferential portion to bond the outer circumferential portions of the substrates 1 and 2 to each other. Between the outer circumferential portions, a strong bonding was attained, and the bonding strength was good. The substrates kept a good airtightness without any problem according to the same high-temperature and high-humidity test (at 85° C./85% Rh for 1000 hours) also. Additionally, the bonding strength after the high-temperature and high-humidity test was also good. Furthermore, the bonding portion was not recognized to be corroded with iodine. However, the electrodes were corroded with iodine. According to this matter, the sealing material according to the present invention can also be developed, besides for sealing colorant-sensitized solar batteries, for covering an electrode, and others. The sealing material can also be developed not only to colorant-sensitized solar batteries but also organic batteries and other electronic components.

EXAMPLE 10

In the present example, a solar battery having therein many photoelectric transducers was produced and evaluated. The used photoelectric transducers were double-sided light-receiving cells in which a monocrystal silicon substrate was used. These cells were connected to each other in series through tab lines. Conventionally, such cells are boned to each other through an EVA sheet between two transparent substrates, and ends of the resultant are fixed through an aluminum frame and a resin sealing material. As the transparent substrates, white glass plates high in transmittance are generally used. Almost all of later-caused accidents of solar batteries are caused by water penetrating the inside thereof. The EVA sheet does not have a high gas barrier performance (airtightness) so that water invades the inside gradually over a long term. The water corrodes tab lines through which cells are connected to each other, or connection portions thereof, or corrodes respective electrodes formed in the cells so that the connection may be broken. It is therefore very important for ensuring a long-term reliability of a solar battery to cause water not to invade the inside thereof.

In the present examples, a highly transparent white glass plate was used as each substrate, and EVA sheets were used as a resin for bonding cells to each other. The thickness of the used double-sided light-receiving cells which included the thickness of respective electrodes located on both surfaces of the cells was about 250 μm. The thickness of bonding layers based on the respective EVA sheets was about 250 μm on both the surfaces of the cells. Thus, the substrates 1 and 2 were bonded to each other to interpose a spacer therebetween, as has been illustrated in FIG. 2. Since the interval between the substrates 1 and 2 was to be about 500 μm, a white glass plate having a width of 3.5 mm and a thickness of 470 μm was used as the spacer 7. As a sealing material paste, the same as used in EXAMPLE 9 was used.

The sealing material paste was initially painted into a width of 3 mm onto each of the outer circumferential portion of the substrate 1 and one surface of the spacer 7 by a dispenser method, and then dried. After the drying, a semiconductor laser 8 having a wavelength of 805 nm was radiated onto the paste while the laser 8 was shifted at a shift speed of 15 mm/second. In this way, a sealing material was formed onto each of the outer circumferential portion of the substrate 1 and the surface of the spacer 7. At this time, the thickness of each of the fired films was about 15 Between the substrates 1 and 2, the spacer 7 was set, on which the several double-sided light-receiving cells and the sealing material were formed. The substrates 1 and 2 were then bonded to each other through the EVA sheets. Semiconductor lasers each having a wavelength of 805 nm were radiated onto the workpiece through both surfaces of the substrate-1-side and the substrate-2-side thereof while shifted at a speed of 15 mm/second along the outer circumferential portions. In this way, the substrates 1 and 2 were bonded to each other to interpose the spacer 7 therebetween. The resultant solar battery was good in both of airtightness and adhesiveness. Of course, this sealing material can ensure reliability over a longer term than resin sealing material.

In the present example, the description has been made about the solar battery in which the double-sided light-receiving Si cells and the EVA sheets were used. However, the present invention is applicable to entire solar batteries as obtained by bonding and fixing cells or transparent substrates by use of resin. The present sealing material can be developed to, for example, thin-film solar batteries also.

The above has described OLED displays, colorant-sensitized solar batteries and Si solar batteries to each of which the present invention is applied. However, the invention is not an invention limited thereto. The invention is applicable to entire electronic components each having therein an organic element or organic material which is low in heat resistance, and makes it possible to improve the electronic components in reliability and productivity.

TABLE 1

| Filler particles | | Primary component (low thermally-expandable material) | Secondary component A (oxide containing bivalent transition metal) | Secondary component B (oxide(s) other than secondary component A) | Thermal expansion coefficient (×10$^{-7}$/° C.) | Density (g/cm$^3$) |
|---|---|---|---|---|---|---|
| Examples | F-01 | Zr$_2$(WO$_4$)(PO$_4$)$_2$ | MnWO$_4$ | Zr$_2$O(PO$_4$)$_2$ | −31 | 4.0 |
| | F-02 | Zr$_2$(WO$_4$)(PO$_4$)$_2$ | FeWO$_4$ | Zr$_2$O(PO$_4$)$_2$ | −33 | 3.9 |
| | F-03 | Zr$_2$(WO$_4$)(PO$_4$)$_2$ | CoWO$_4$ | Zr$_2$O(PO$_4$)$_2$ | −32 | 4.1 |
| | F-04 | Zr$_2$(WO$_4$)(PO$_4$)$_2$ | NiWO$_4$ | Zr$_2$O(PO$_4$)$_2$ | −32 | 3.9 |
| | F-05 | Zr$_2$(WO$_4$)(PO$_4$)$_2$ | CuWO$_4$ | Zr$_2$O(PO$_4$)$_2$ | −27 | 4.1 |
| | F-06 | LiAlSiO$_4$ | CoAl$_2$O$_4$ or/and Co$_2$SiO$_4$ | — | −54 | 2.5 |
| | F-07 | SiO$_2$ (amorphous) | Co$_2$SiO$_4$ | — | 8 | 2.4 |
| | F-08 | Mg$_2$Al$_4$Si$_5$O$_{18}$ | CoAl$_2$O$_4$ or/and Co$_2$SiO$_4$ | — | 6 | 2.6 |
| Comparative Examples | F-09 | Zr$_2$(WO$_4$)(PO$_4$)$_2$ | — | — | −35 | 3.8 |
| | F-10 | Zr$_2$(WO$_4$)(PO$_4$)$_2$ | — | Fe$_2$O$_3$ | −31 | 3.9 |
| | F-11 | Zr$_2$O(PO$_4$)$_2$ | — | — | 7 | 3.7 |
| | F-12 | Zr$_2$O(PO$_4$)$_2$ | — | FePO$_4$ and ZrO$_2$ | 12 | 3.5 |
| | F-13 | LiAlSiO$_4$ | — | — | −54 | 2.4 |
| | F-14 | SiO$_2$ (amorphous) | — | — | 5 | 2.2 |
| | F-15 | Mg$_2$Al$_4$Si$_5$O$_{18}$ | — | — | 3 | 2.5 |

TABLE 2

| Filler particles | | Laser radiation experiment | | | | |
|---|---|---|---|---|---|---|
| | | 405 nm wavelength | 532 nm wavelength | 630 nm wavelength | 805 nm wavelength | 1064 nm wavelength |
| Examples | F-01 | o | o | o | o | o |
| | F-02 | o | o | o | o | o |
| | F-03 | o | o | o | o | o |
| | F-04 | o | o | o | o | o |
| | F-05 | o | o | o | o | o |
| | F-06 | o | o | o | o | o |
| | F-07 | o | o | o | o | o |
| | F-08 | o | o | o | o | o |
| Comparative Examples | F-09 | x | x | x | x | x |
| | F-10 | x | x | x | x | x |
| | F-11 | x | x | x | x | x |
| | F-12 | x | x | x | x | x |
| | F-13 | x | x | x | x | x |
| | F-14 | x | x | x | x | x |
| | F-15 | x | x | x | x | x |

| Low-melting-point glass | | Glass system | Transition point (° C.) | Softening point (° C.) | Thermal expansion coefficient (×10$^{-7}$/° C.) | Density (g/cm$^3$) |
|---|---|---|---|---|---|---|
| Examples | G-01 | V—P—Sb—Ba—O | 373 | 445 | 78(30~250° c.) | 3.4 |
| | G-02 | V—Te—P—Sb—Ba—O | 313 | 365 | 98(30~250° c.) | 3.6 |
| | G-03 | V—Te—Ba—W—P—K—O | 278 | 337 | 156(30~250° c.) | 4.1 |
| | G-04 | V—Te—P—Fe—O | 293 | 355 | 100(30~250° c.) | 3.6 |
| | G-05 | V—Te—Fe—P—O | 308 | 376 | 93(30~250° c.) | 3.7 |
| | G-06 | V—Te—Fe—P—O | 341 | 406 | 86(30~250° c.) | 3.6 |
| | G-07 | Ag—V—Te—O | 163 | 208 | 190(30~150° c.) | 5.8 |
| | G-08 | Ag—V—Te—W—O | 169 | 216 | 184(30~150° c.) | 5.7 |
| | G-09 | Ag—V—Te—W—P—O | 236 | 294 | 157(30~150° c.) | 5.4 |
| | G-10 | Ag—V—Te—W—P—W—Ba—O | 207 | 264 | 187(30~150° c.) | 5.5 |
| Comparative Example | G-11 | Bi—B—Zn—Ba—O | 368 | 445 | 107(30~250° c.) | 6.6 |
| | G-12 | Sn—P—Zn—B—O | 314 | 412 | 118(30~250° c.) | 3.1 |
| | G-13 | Ag—P—Te—O | 192 | 319 | 178(30~150° c.) | 6.3 |

| Low-melting-point glass | | Softening fluidity through laser radiation | | | | | Notes |
|---|---|---|---|---|---|---|---|
| | | 405 nm wavelength | 532 nm wavelength | 630 nm wavelength | 805 nm wavelength | 1064 nm wavelength | |
| Examples | G-01 | o | o | o | o | o | Vanadic acid glass |
| | G-02 | o | o | o | o | o | |
| | G-03 | o | o | o | o | o | |
| | G-04 | o | o | o | o | o | |
| | G-05 | o | o | o | o | o | |
| | G-06 | o | o | o | o | o | |
| | G-07 | o | o | o | o | o | Vanadate silver glass |
| | G-08 | o | o | o | o | o | |
| | G-09 | o | o | o | o | o | |
| | G-10 | o | o | o | o | o | |

| | | | | | | | | |
|---|---|---|---|---|---|---|---|---|
| Comparative Example | G-11 | x | | x | x | x | Glass containing no vanadium |
| | G-12 | x | x | x | x | x | |
| | G-13 | x | x | x | x | x | |

TABLE 4

| | | Laser shift speed | Filler particles |||||||||||||||
|---|---|---|---|---|---|---|---|---|---|---|---|---|---|---|---|---|
| | | | Examples ||||||||| Comparative Examples |||||||
| Low-melting-point glass | | | F-01 | F-02 | F-03 | F-04 | F-05 | F-06 | F-07 | F-08 | F-09 | F-10 | F-11 | F-12 | F-13 | F-14 | F-15 |
| Examples | G-01 | 10 mm/s | ○ | ○ | ○ | ○ | ○ | ○ | ○ | ○ | Δ | Δ | Δ | Δ | x | x | x |
| | | 20 mm/s | ○ | ○ | ○ | ○ | ○ | Δ | Δ | Δ | Δ | Δ | x | x | x | x | x |
| | | 30 mm/s | Δ | Δ | Δ | Δ | Δ | Δ | Δ | Δ | x | x | x | x | x | x | x |
| | G-02 | 10 mm/s | ○ | ○ | ○ | ○ | ○ | ○ | ○ | ○ | ○ | ○ | ○ | Δ | x | x | x |
| | | 20 mm/s | ○ | ○ | ○ | ○ | ○ | ○ | ○ | ○ | ○ | ○ | Δ | Δ | x | x | x |
| | | 30 mm/s | ○ | ○ | ○ | ○ | ○ | Δ | Δ | Δ | x | x | x | x | x | x | x |
| | G-03 | 10 mm/s | ○ | ○ | ○ | ○ | ○ | ○ | ○ | ○ | ○ | ○ | Δ | Δ | x | x | x |
| | | 20 mm/s | ○ | ○ | ○ | ○ | ○ | ○ | ○ | ○ | Δ | Δ | x | x | x | x | x |
| | | 30 mm/s | ○ | ○ | ○ | ○ | ○ | Δ | Δ | Δ | x | x | x | x | x | x | x |
| | G-04 | 10 mm/s | ○ | ○ | ○ | ○ | ○ | ○ | ○ | ○ | ○ | ○ | ○ | Δ | x | x | x |
| | | 20 mm/s | ○ | ○ | ○ | ○ | ○ | ○ | ○ | ○ | ○ | Δ | Δ | Δ | x | x | x |
| | | 30 mm/s | ○ | ○ | ○ | ○ | ○ | ○ | ○ | ○ | x | x | x | x | x | x | x |
| | G-05 | 10 mm/s | ○ | ○ | ○ | ○ | ○ | ○ | ○ | ○ | ○ | ○ | Δ | Δ | x | x | x |
| | | 20 mm/s | ○ | ○ | ○ | ○ | ○ | ○ | ○ | ○ | Δ | Δ | Δ | Δ | x | x | x |
| | | 30 mm/s | ○ | ○ | ○ | ○ | ○ | ○ | ○ | ○ | x | x | x | x | x | x | x |
| | G-06 | 10 mm/s | ○ | ○ | ○ | ○ | ○ | ○ | ○ | ○ | ○ | ○ | ○ | Δ | x | x | x |
| | | 20 mm/s | ○ | ○ | ○ | ○ | ○ | ○ | ○ | ○ | ○ | Δ | Δ | Δ | x | x | x |
| | | 30 mm/s | ○ | ○ | ○ | ○ | ○ | ○ | ○ | ○ | x | x | x | x | x | x | x |
| | G-07 | 10 mm/s | ○ | ○ | ○ | ○ | ○ | ○ | ○ | ○ | ○ | ○ | ○ | ○ | ○ | ○ | ○ |
| | | 20 mm/s | ○ | ○ | ○ | ○ | ○ | ○ | ○ | ○ | Δ | Δ | Δ | Δ | x | x | x |
| | | 30 mm/s | ○ | ○ | ○ | ○ | ○ | ○ | ○ | ○ | x | x | x | x | x | x | x |
| | G-08 | 10 mm/s | ○ | ○ | ○ | ○ | ○ | ○ | ○ | ○ | ○ | ○ | ○ | ○ | ○ | ○ | ○ |
| | | 20 mm/s | ○ | ○ | ○ | ○ | ○ | ○ | ○ | ○ | Δ | Δ | Δ | Δ | x | x | x |
| | | 30 mm/s | ○ | ○ | ○ | ○ | ○ | ○ | ○ | ○ | x | x | x | x | x | x | x |
| | G-09 | 10 mm/s | ○ | ○ | ○ | ○ | ○ | ○ | ○ | ○ | ○ | ○ | ○ | ○ | Δ | Δ | Δ |
| | | 20 mm/s | ○ | ○ | ○ | ○ | ○ | ○ | ○ | ○ | Δ | Δ | x | x | x | x | x |
| | | 30 mm/s | ○ | ○ | ○ | ○ | ○ | ○ | ○ | ○ | x | x | x | x | x | x | x |
| | G-10 | 10 mm/s | ○ | ○ | ○ | ○ | ○ | ○ | ○ | ○ | ○ | ○ | ○ | ○ | ○ | ○ | ○ |
| | | 20 mm/s | ○ | ○ | ○ | ○ | ○ | ○ | ○ | ○ | Δ | Δ | Δ | Δ | x | x | x |
| | | 30 mm/s | ○ | ○ | ○ | ○ | ○ | ○ | ○ | ○ | x | x | x | x | x | x | x |
| Comparative Examples | G-11 | 10 mm/s | Δ | Δ | Δ | Δ | Δ | Δ | Δ | Δ | x | x | x | x | x | x | x |
| | | 20 mm/s | x | x | x | x | x | x | x | x | x | x | x | x | x | x | x |
| | | 30 mm/s | x | x | x | x | x | x | x | x | x | x | x | x | x | x | x |
| | G-12 | 10 mm/s | Δ | Δ | Δ | Δ | Δ | Δ | Δ | Δ | x | x | x | x | x | x | x |
| | | 20 mm/s | x | x | x | x | x | x | x | x | x | x | x | x | x | x | x |
| | | 30 mm/s | x | x | x | x | x | x | x | x | x | x | x | x | x | x | x |
| | G-13 | 10 mm/s | ○ | ○ | ○ | ○ | ○ | ○ | ○ | ○ | x | x | x | x | x | x | x |
| | | 20 mm/s | Δ | Δ | Δ | Δ | Δ | Δ | Δ | Δ | x | x | x | x | x | x | x |
| | | 30 mm/s | x | x | x | x | x | x | x | x | x | x | x | x | x | x | x |

REFERENCE SIGNS LIST

1 and 2: substrates, 3: organic member, 4: low-melting glass, 5: filler particles, 6 and 6': bonding portions, 7: spacer, 8 and 8': lasers, 9: pressed powder shaped body, 10: primary component, 11: secondary component A, 12: secondary component B, and 106 and 106': fired sealing materials.

The invention claimed is:

1. An electronic component comprising:
   two substrates at least one of which is transparent;
   an organic member arranged between these substrates; and
   a bonding portion located onto respective outer circumferential portions of the two substrates,
   wherein the bonding portion includes a low-melting glass and filler particles, the low-melting glass includes vanadium oxide, the filler particles include a low thermally-expandable material, and an oxide containing a bivalent transition metal as a constituent element, the oxide is dispersed in the low thermally-expandable material, and the low thermally-expandable material has a thermal expansion coefficient of $5 \times 10^{-7}/°$C. or less in a temperature range from 30 to 250° C.

2. The electronic component according to claim 1, wherein the bivalent transition metal is one or more selected from Mn, Fe, Co, Ni and Cu.

3. The electronic component according to claim 1, wherein the oxide is one or more selected from MnWO4, FeWO4, CoWO4, NiWO4 and CuWO4.

4. The electronic component according to claim 1, wherein the low thermally-expandable material is one or more selected from Zr2(WO4)(PO4)2, LiAlSiO4, SiO2 and Mg2Al4Si5O18.

5. The electronic component according to claim 3, wherein the low thermally-expandable material is Zr2(WO4)(PO4)2, and the content by percentage of the compound Zr2(WO4)(PO4)2 in the filler particles is from 80 to 98% by mass.

6. The electronic component according to claim 1,
wherein the low-melting glass is an oxide glass which contains V, Te, Fe and P, or an oxide glass which contains V, Ag and Te.

7. The electronic component according to claim 1,
wherein a content of the filler particles is from 10 to 100 parts by volume for 100 parts by volume of the low-melting glass.

8. A sealing material paste comprising:
filler particles that comprise a low thermally-expandable material and an oxide that includes a bivalent transition metal as a constituent element;
low-melting glass particles containing vanadium oxide; and
an organic solvent;
wherein the oxide is dispersed in the low thermally-expandable material, and the low thermally-expandable material has a thermal expansion coefficient of $5 \times 10^{-7}/°C$. or less in a temperature range from 30 to 250° C.

9. The sealing material paste according to claim 8,
wherein the low-melting glass particles are an oxide glass containing V, Te, Fe and P.

10. The sealing material paste according to claim 9,
wherein the low-melting glass particles have a transition point of 350° C. or lower, and a softening point of 410° C. or lower.

11. The sealing material paste according to claim 8,
wherein the low-melting glass particles are an oxide glass containing V, Ag and Te.

12. The sealing material paste according to claim 11,
wherein the low-melting glass particles have a transition point of 240° C. or lower, and a softening point of 300° C. or lower.

13. The sealing material paste according to claim 8,
wherein a content of the filler particles is from 10 to 100 parts by volume for 100 parts by volume of the low-melting glass.

14. A process for producing an electronic component,
the electronic component comprising:
two substrates at least one of which is transparent;
an organic member arranged between these substrates; and
a bonding portion located onto respective outer circumferential portions of the two substrates,
the process comprising the steps of:
applying the sealing material paste recited in claim 8 to the outer circumferential portion of either one of the two substrates;
drying, or drying and firing the sealing material paste, thereby fixing the sealing material;
arranging the substrates to cause the sealing-material-fixed surface of the substrate to face and be in contact with a flat plane of the other substrate, and fixing the two substrates to each other; and
radiating a laser having a wavelength ranging from 400 to 1100 nm across the transparent substrate to the sealing material thereby rendering the sealing material the bonding portion.

15. The method for producing the electronic component according to claim 14,
wherein the firing is attained in a firing furnace, or by radiation of a laser having a wavelength ranging from 400 to 1100 nm.

16. The sealing material paste according to claim 8,
wherein the low thermally-expandable material includes LiAlSiO4 and the bivalent transition metal is one or more selected from Mn, Fe, Co, Ni and Cu.

17. The sealing material paste according to claim 8,
wherein the oxide is one or more selected from MnWO4, FeWO4, CoWO4, NiWO4 and CuWO4.

18. The sealing material paste according to claim 8,
wherein the low thermally-expandable material further includes one or more selected from Zr2(WO4)(PO4)2, SiO2 and Mg2Al4Si5O18.

19. The sealing material paste according to claim 8,
wherein a percentage of the low thermally expandable material is from 80 to 98% by weight.

* * * * *